(12) United States Patent
Norman et al.

(10) Patent No.: US 8,507,365 B2
(45) Date of Patent: Aug. 13, 2013

(54) GROWTH OF COINCIDENT SITE LATTICE MATCHED SEMICONDUCTOR LAYERS AND DEVICES ON CRYSTALLINE SUBSTRATES

(75) Inventors: Andrew G. Norman, Evergreen, CO (US); Aaron J. Ptak, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 345 days.

(21) Appl. No.: 12/643,127

(22) Filed: Dec. 21, 2009

(65) Prior Publication Data

US 2011/0147791 A1    Jun. 23, 2011

(51) Int. Cl.
*H01L 21/20* (2006.01)

(52) U.S. Cl.
USPC ............ 438/478; 257/190; 257/E21.093; 257/E29.004

(58) Field of Classification Search
USPC ............ 257/94, 183, 190, E21.093; 438/478
See application file for complete search history.

(56) References Cited

U.S. PATENT DOCUMENTS

| | | | |
|---|---|---|---|
| 4,136,207 A | 1/1979 | Bender | |
| 5,793,061 A | 8/1998 | Ohuchi et al. | |
| 5,796,771 A | 8/1998 | DenBaars et al. | |
| 6,281,426 B1 | 8/2001 | Olson et al. | |
| 6,498,050 B2 | 12/2002 | Fujimoto | |
| 6,518,077 B2 | 2/2003 | Narayan et al. | |
| 6,605,486 B2 | 8/2003 | Fujimoto | |
| 6,759,139 B2 | 7/2004 | Kunisato et al. | |
| 6,844,084 B2 * | 1/2005 | Kokta et al. | 428/640 |
| 6,951,819 B2 | 10/2005 | Iles et al. | |
| 7,012,283 B2 | 3/2006 | Tsuda et al. | |
| 7,122,733 B2 | 10/2006 | Narayanan et al. | |
| 7,211,836 B2 | 5/2007 | Udagawa | |
| 7,220,324 B2 | 5/2007 | Baker et al. | |
| 7,390,684 B2 | 6/2008 | Izuno et al. | |
| 7,601,215 B1 | 10/2009 | Wang et al. | |
| 7,615,400 B2 | 11/2009 | Goto et al. | |

(Continued)

FOREIGN PATENT DOCUMENTS

| | | |
|---|---|---|
| WO | 03084886 | 10/2003 |
| WO | 2004022820 | 3/2004 |

(Continued)

OTHER PUBLICATIONS

Kaneko et al. "Cubic-on-cubic growth of a MgO(001) thin film prepared on Si(001) substrate at low ambient pressure by the sputter method." EPL, 81 (2008) 46001.*

(Continued)

*Primary Examiner* — Wensing Kuo
(74) *Attorney, Agent, or Firm* — J. Patrick Kendrick; Paul J. White; John C. Stolpa

(57) ABSTRACT

Methods of fabricating a semiconductor layer or device and said devices are disclosed. The methods include but are not limited to providing a substrate having a crystalline surface with a known lattice parameter (a). The method further includes growing a crystalline semiconductor layer on the crystalline substrate surface by coincident site lattice matched epitaxy, without any buffer layer between the crystalline semiconductor layer and the crystalline surface of the substrate. The crystalline semiconductor layer will be prepared to have a lattice parameter (a') that is related to the substrate lattice parameter (a). The lattice parameter (a') maybe related to the lattice parameter (a) by a scaling factor derived from a geometric relationship between the respective crystal lattices.

34 Claims, 10 Drawing Sheets

U.S. PATENT DOCUMENTS

| | | | |
|---|---|---|---|
| 2002/0144725 | A1 | 10/2002 | Jordan et al. |
| 2003/0015728 | A1 | 1/2003 | Bosco et al. |
| 2003/0162271 | A1 | 8/2003 | Zhang et al. |
| 2005/0124161 | A1* | 6/2005 | Rawdanowicz et al. ...... 438/689 |
| 2006/0060237 | A1 | 3/2006 | Leidholm et al. |
| 2006/0126688 | A1 | 6/2006 | Kneissl |
| 2006/0236923 | A1 | 10/2006 | Kouvetakis et al. |
| 2007/0243703 | A1 | 10/2007 | Pinnington et al. |
| 2008/0029151 | A1 | 2/2008 | McGlynn et al. |
| 2008/0191203 | A1 | 8/2008 | Fujioka et al. |
| 2008/0230779 | A1 | 9/2008 | Goyal |
| 2008/0245409 | A1 | 10/2008 | Varghese et al. |
| 2008/0265255 | A1 | 10/2008 | Goyal |
| 2008/0308836 | A1 | 12/2008 | Nakahara et al. |
| 2009/0032799 | A1 | 2/2009 | Pan |
| 2009/0042344 | A1 | 2/2009 | Ye et al. |
| 2009/0045393 | A1 | 2/2009 | Nakahara |
| 2009/0065047 | A1 | 3/2009 | Fiorenza et al. |
| 2009/0078311 | A1 | 3/2009 | Stan et al. |
| 2009/0087941 | A1 | 4/2009 | Goto et al. |
| 2009/0140296 | A1* | 6/2009 | Park et al. ...................... 257/194 |
| 2009/0155952 | A1 | 6/2009 | Stan et al. |
| 2010/0212729 | A1* | 8/2010 | Hsu .............................. 136/255 |
| 2011/0048514 | A1* | 3/2011 | Norman et al. ............... 136/255 |
| 2011/0049520 | A1* | 3/2011 | Norman et al. ................. 257/64 |

FOREIGN PATENT DOCUMENTS

| | | |
|---|---|---|
| WO | 2004025707 | 3/2004 |
| WO | 2006033858 A1 | 3/2006 |
| WO | 2007025062 | 3/2007 |
| WO | 2008112115 | 9/2008 |

OTHER PUBLICATIONS

Rawdanowicz "Laser Molecular Beam Epitaxial Growth and Properties of III-Nitride Thin Film Heterostructures on Silicon." dissertation (2005), Materials Science and Engineering, NC State University.*

Andrianov, et al., "Time-Resolved Photoluminescence of Polycrystalline GaN Layers of Metal Substrates", Semidconductors, 2002, vol. 36, No. 8, pp. 878-882.

As, et al., "Heteroepitaxy of Doped and Undoped Cubic Group III-Nitrides", physica status solidi (a), 1999, vol. 176, pp. 475-485.

Asahi, et al., "Strong Photoluminescence Emission from Polycrystalline GaN Grown on Metal Substrate by NH3 Source MBE", physica status solidi (a), 2001, vol. 188, No. 2, pp. 601-604.

Haxel, et al. "Rare Earth Elements—Critical Resources for High Technology", U.S. Geological Survey Fact Sheet 087-02, 2002, pp. 1-4.

Bailey, et al. "Thin Film Poly III-V Space Solar Cells", Proceedings of the 33rd IEEE PVSC, May 2007, pp. 1-5, San Diego, California.

Baker, et al., "Characterization of Plannar Semipolar Gallium Nitride Films on Spinel Substrates", Japanese Journal of Applied Physics, 2005, vol. 44, No. 29, pp. L920-L922.

Baur, et al., "Triple-Junction III-V Based Concentrator Solar Cells: Perspectives and Challenges", Journal of Solar Energy Engineering, Aug. 2007, Cvol. 129, pp. 258-265.

Bergh, et al., "The Promise and Challenge of Solid-State Lighting", Physics Today, Dec. 2001, pp. 42-47.

Oh, et al., "Epitaxial Growth and Characterization of GaAs/A1/GaAs Herterostructures", Surface Science, 1990, vol. 228, pp. 16-19.

Bhattacharya, et al., "Growth and characterization of GaAs/A1/GaAs heterostructures", Journal of Applied Physiology, Apr. 15, 1990, vol. 67, No. 8, pp. 3700-3705.

Cantoni, et al., "Reflection high-energy electron diffraction studies of epitaxial oxide seed-layer growth on rolling-assisted biaxially textured substrate Ni (001): The role of surface structure and chemistry", Applied Physics Letters, Nov. 5, 2001, vol. 79, No. 19, pp. 3077-3079.

Cho, et al., "Single-crystal-aluminum Schottky-barrier diodes prepared by molecular-beam epitaxy (MBE) on GaAs", Journal of Applied Physiology, Jun. 1978, vol. 49, No. 6, pp. 3328-3332.

Efimov, et al., "On an Unusaul Azimuthal Orientational Relationship in the System Gallium Nitride Layer on Spinel Substrate", Crystallography Reports, 2000, vol. 45, No. 2, pp. 312-317.

Feltrin, et al., "Material considerations for terawatt level deployment of photovoltaics", Renewable Energy, 2008 pp. 180-185.

Findikoglu, et al., "Aligned-Crystalline Silicon Films on Non-Single-Crystalline Substrates", Los Alamos National Laboratory publication, MRS, 2006, Report No. LA-UR-6-1165, pp. 1-11.

Freitas, Jr., et al., "Properties of epitaxial GaN on refractory metal substrates", Applied Physics Letters, 2007, vol. 90, pp. 091910-1-091910-3.

Fritzemeier, et al., "Progress Toward High Efficiency Thin Film Photovoltaics", High-Performance PV—2007 Program Review Meeting, 2007, pp. 1-2.

Geisz, et al., "III-N-V semiconductors for solar photovoltaic applications", Semiconductor Science and Technology, 2002, vol. 17, pp. 769-777.

Geisz, et al., "High-efficiency GaInP/GaAS/InGaAs triple-junction solar cells grown inverted with a metamorphic bottom junction", Applied Physics Letters, 2007, vol. 91, pp. 023502-1-023502-3.

Geisz, et al., "40.8% efficient inverted triple-junction solar cell with two independently metamorphic junctions", Applied Physics Letters, 2008, vol. 93, pp. 123505-1-123505-3.

George, et al., "Novel symmetry in the growth gallium nitride on magnesium aluminate substrates", Applied Physics Letters, Jan. 15, 1996, vol. 68, No. 3, pp. 337-339.

Goyal, et al., "The RABiTS Approach: Using Rolling-Assisted Biaxially Textured Substrates for High-Performance YBCO Superconductors", MRS Bulletin, Aug. 2004, pp. 552-561.

Haworth, et al., Investigation into the influence of buffer and nitrided layers on the initial stages of GaN growth on InSb (100), Applied Surface Science, 2000, vol. 166, pp. 418-422.

Hirata, et al., "Epitaxial growth of A1N films on single-crystalline Ta substrates", Journal of Solid State Chemistry, 2007, vol. 180, pp. 2335-2339.

Hu, et al., "Nucleation and growth of epitaxial ZrB2(0 0 0 1) on Si (1 1 1)", Journal of Crystal Growth, 2004, vol. 267, pp. 554-563.

Inoue, et al., "Epitaxial growth of A1N on Cu (1 1 1) substrates using pulsed paser deposition", Journal of Crystal Growth, 2006, vol. 289, pp. 574-577.

Inoue, et al., "Epitaxial growth of GaN on copper substrates", Applied Physics Letters, 2006, vol. 88, pp. 261910-1-261910-3

Khan, et al., "Cleaved cavity optically pumped InGaN-GaN laser grown on spinel substrates", Applied Physics Letters, Oct. 14, 1996, vol. 69, No. 16, pp. 2418-2420.

King, et al., "40% efficient metamorphic GaInP/GaInAs/Ge multijunction solar cells", Applied Physics Letters, 2007, vol. 90, pp. 183516-1-183516-3

King, "Multijunction solar cells used in concentrator photovoltaics have enabled record-breakiong efficiencies in electricity generation from the Sun's energy, and have the potential to make solar electricity cost-effective at the utility scale", Nature Photonics, May 2008, vol. 2, pp. 284-286.

Kuo, "Bowing parameter of zincblende $InxGa_{1-x}N$", Optics Communications, 2007, vol. 280, pp. 153-156.

Kuramata, et al., "Properties of GaN Epitaxial Layer Grown on (111) MgA12O4 Substrate", Solid-State Electronics, 1997, vol. 41, No. 2, pp. 251-254.

Li, et al., "Room temperature green light emission from nonpolar cubic InGaN/GaN multi-quantum-wells", Applied Physics Letters, 2007, vol. 90, pp. 071903-1-071903-3.

Li, et al., "Room-Temperature Epitaxial Growth of GaN on Atomically Flat MgA12O4 Substrates by Pulsed-Laser Depostition", Japanese Journal of Applied Physics, 2006, vol. 45, No. 17, pp. L457-L459.

Li, et al., "Epitaxial growth of single-crystalline A1N films on tungsten substrates", Applied Physics Letters, 2006, vol. 89, pp. 241905-1-241905-3.

Lieten, et al., "Suppression of domain formation in GaN layers grown on Ge (1 1 1)", Journal of Crystal Growth, 2009, vol. 311, pp. 1306-1310.

Ludeke, "Morphological and chemical considerations for the epitaxy of metals on semiconductors", Journal of Vacuum Science & Technology. B, Microelectronics and nanometer structures : processing, measurement, and phenomena : an official journal of the American Vacuum Society, Jul.-Sep. 1984, vol. 2, No. 3, pp. 400-406.

Massies, et al., "Epitaxial Relationships between Al, Ag and GaAs{001} Surfaces", Surface Science, 1982, vol. 114, pp. 147-160.

Mikulics, et al, "Growth and properties of GaN and AlN layers on silver substrates", Applied Physics Letters, 2005, vol. 87, pp. 212109-1-212109-3.

Mitamura, et al., "Growth of InN films on spinel substrates by puled laser deposition", physica status solidi (RRL)—Rapid Research Letters, 2007, vol. 1, No. 5, pp. 211-213.

Nikishin, et al., "Gas source molecular beam epitaxy of GaN with hydrazine on spinel substrates", Applied Physics Letter, May 11, 1998, pp. 2361-2363.

Norman, et al., "Low cost III-PV on Al-foil substrates", FY09 AOP Proposal—Seed Fund Project, 2009, pp. 1-5.

Norton, et al., "Epitaxial YBa2Cu3O7 on Biaxially Textured Nickel (001): An Approach to Superconducting Tapes with High Critical Current Density", Science, Nov. 1, 1996, vol. 274, pp. 755-757.

Pacheco-Salazar, et al., "Photoluminescence measurements on cubic InGaN layers deposited on a SiC substrate", Semiconductor Science and Technology, 2006, vol. 21, pp. 846-851.

Palmstøm, "Epitaxy of Dissimilar Materials", Annual Review of Materials Science, 1995, vol. 25, pp. 389-415.

Pan, et al., "Increasing cube texture in high purity aluminium foils for capacitors", Materials Science and Technology, 2005, vol. 21, No. 12, pp. 1432-1435.

Phillips, et al., "Research challenges to ultra-efficient inorganic solid-state lighting", Laser & Photonics Reviews, 2007, vol. 1, No. 4., pp. 307-333.

Phillips, et al., "UK cracks GaN-on-silicon LEDs", Compound Semidconductor, Mar. 2009, pp. 19-22.

Pilkington, et al., "The growth of epitaxial aluminium on As containing compound semiconductors", Journal of Crystal Growth, 1999, vol. 196, pp. 1-12.

Sacks, et al., "Growth and characterization of epitaxial FexAl1-x/(In,Al)As/InP and III-V/FexAl1-x/(In,Al)As/InP structures", Journal of Vacuum Science & Technology. B, Microelectronics and nanometer structures : processing, measurement, and phenomena : an official journal of the American Vacuum Society, May/Jun. 1999, vol. 17, No. 3, pp. 1289-1293.

Sands, et al., "Epitaxial growth of GaAs/NiAl/GaAs heterostructures", Applied Physics Letters, Apr. 11, 1988, vol. 52, No. 15, pp. 1216-1218.

Sands, et al., "Epitaxial Metal (NiAl)-Semiconductor (III-V) Heterostructures by MBE", Surface Science, 1990, vol. 228, pp. 1-8.

Scarpulla, et al., "GdN (1 1 1) heteroepitaxy on GaN (0 0 0 1) by N2 plasma and NH3 molecular beam epitaxy", Journal of Crystal Growth, 2009, vol. 311, pp. 1239-1244.

Sun, et al., "Mg-doped green light emitting diodes over cubic (111) MgAl2O4 substrates", Applied Physics Letters, Mar. 17, 1997, vol. 70, No. 11, pp. 1444-1446.

Suzuki, et al., "MBE growth of GaN on MgO substrate", Journal of Crystal Growth, 2007, vols. 301-302, pp. 478-481.

Tadayon, et al., "Growth of GaAs-Al-GaAs by migration-enhanced epitaxy", Applied Physics Letters, Dec. 26, 1988, vol. 53, No. 26, pp. 2664-2665.

Tinjod, et al., "Alumina-rich spinel: A new substrate for the growth of high quality GaN-based light-emitting diodes", Journal of Crystal Growth, 2005, vol. 285, pp. 450-458.

Tolle, et al., "Epitaxial growth of group III nitrides on silicon substrates via a reflective lattice-matched zirconium diboride buffer layer", Applied Physics Letters, Apr. 14, 2003, vol. 82, No. 15, pp. 2398-2400.

Trampert, et al., "Heteroepitaxy of Large-Misfit Systems: Role of Coincidence Lattice", Crystal Research and Technology, 2000, vol. 35, pp. 793-806.

Tsuchiya, et al., "Initial stages of InN thin film growth onto MgAl2O4 (111) and α-Al2O3 (0 0 -1) substrates", Journal of Crystal Growth, 2000, vol. 220, pp. 191-196.

Vurgaftman, et al., "Band parameters for nitrogen-containing semiconductors", Journal of Applied Physics, Sep. 15, 2001, vol. 94, No. 6, pp. 3675-3696.

Yang, et al., "Microstructure evolution of GaN buffer layer on MgAl2O4 substrate", Journal of Crystal Growth, 1998, vol. 193, pp. 478-483.

Yamada, et al., "Strong photoluminescene emission from polycrystalline GaN layers grown on W, Mo, Ta, and Nb metal substrates", Applied Physics Letters, May 7, 2001, vol. 78, No. 19, pp. 2849-2851.

Yao, et al., "Fabrication of AlAs/Al/AlAs heterostructures by molecular beam epitaxy and migration enhanced epitaxy", Journal of Crystal Frowth, 1991, vol. 111, pp. 221-227.

Wang, et al., "Lattice Parameters and Local Lattice Distortions in fcc-Ni Solutions", Metallurgical and Materials Transactions A, Mar. 2007, vol. 38A, pp. 562-569.

Zhao, et al., "Transmission electron microscrope study on electrodeposited Gd2O3 and Gd2Zr2O7 buffer layers for YBa2Cu3O7-δ superconductors", Physica C, 2008, vol. 468, pp. 1092-1096.

Kuznetsov, G.F. et al., "General Orientational Characteristics of Heteroepitaxial Layers of AII and BVI Semiconductors on Sapphire and Semiconductor Substrates with Diamond and Sphalerite Structures (AIIIBV)," Crystallography Reports, vol. 47, No. 3, Nov. 3, 2002, pp. 514-518.

Narayan, J., et al., "Domain epitaxy: A unified paradigm for thin film growth," Journal of Applied Physics, V93, No. 1, pp. 278-285 (2003).

Goyal, A., et al., "Low Cost, Single Crystal-like Substrates for Practical, High Efficiency Solar Cells," AIP Conf. Proc. V404, pp. 377-394 (1997).

Ohta, J., et al., "Epitaxial growth of InN on nearly lattice-matched (Mn,Zn)Fe2O4," Solid State Communications, V137, pp. 208-211 (2006).

Tramped, A., "Heteroepitaxy of dissimilar materials: effect of interface structure on strain and defect formation," Physica E, V13, pp. 1119-1125 (2002).

Yang, J.W., et al., "InGaNGaN based lightemitting diodes over (111) spinel substrates," Applied Physics Letters, V69, pp. 369-370 (1996).

Zhou, G., "Metal-oxide interfaces at the nanoscale," Applied Physics Letters, V94, pp. 233115 1-3, (2009).

Armitage, R., et al., "Lattice-matched HfN buffer layers for epitaxy of GaN on Si," V81, No. 8, pp. 1450-1452, (2002).

Tolle, J., et al., "Epitaxial growth of group III nitrides on silicon substrates via a reflective lattice-matched zirconium diboride buffer layer," Applied Physics Letters, V82, pp. 2398-2400 (2003).

Hooks, D.E., et al., "Epitaxy and Molecular Organization on Solid Substrates," Advanced Materials (2000).

Zheleva, T., et al., "Epitaxial growth in largelatticemismatch systems," Journal of Applied Physics, V75, pp. 860-871 (1994).

Narayan, J., "New Frontiers in Thin Film Growth and Nanomaterials," Mettallurgical and Materials Transactions B, V36B, pp. 5-22 (2005).

Oh, J.E., et al., "Epitaxial Growth and Characteristics on GaAs/Al/GaAs Heterostructures,"Surface Science, V228 pp. 16-19 (1990).

* cited by examiner

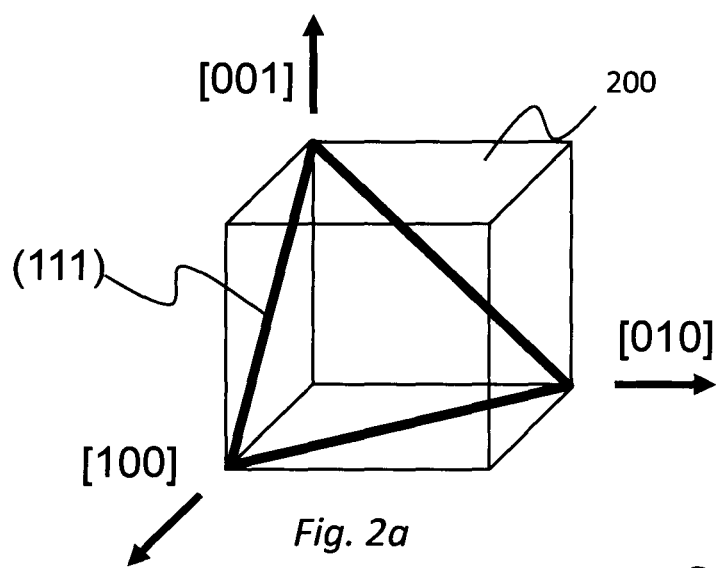
Fig. 2a
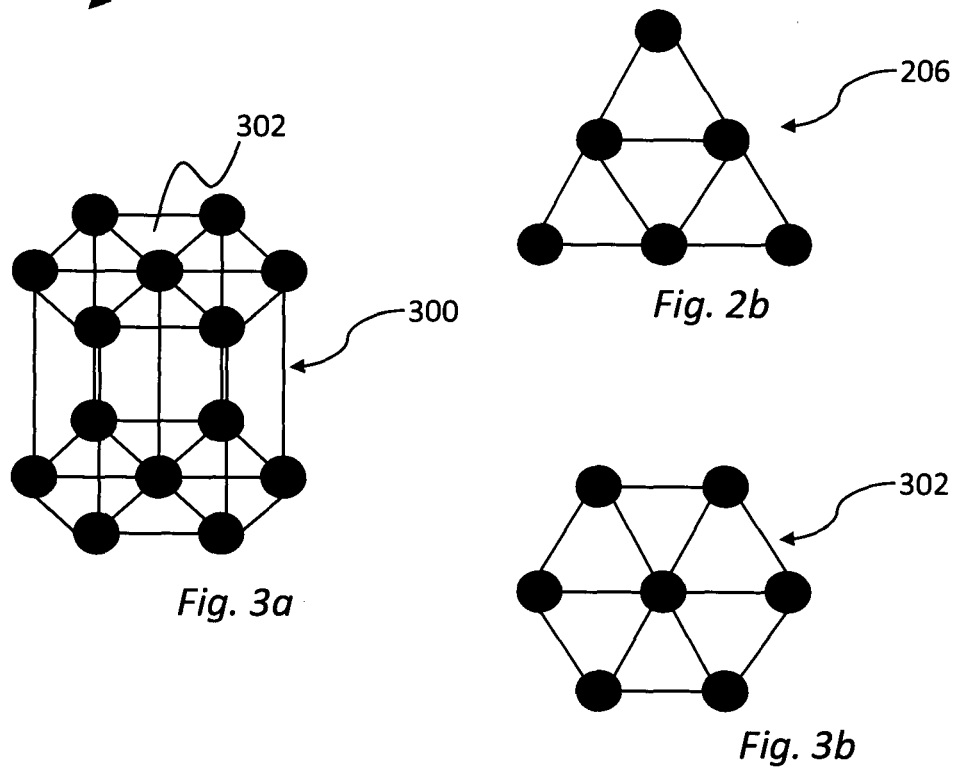
Fig. 3a
Fig. 2b
Fig. 3b

GROWTH OF COINCIDENT SITE LATTICE MATCHED SEMICONDUCTOR LAYERS AND DEVICES ON CRYSTALLINE SUBSTRATES

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Various types of semiconductor devices may be best fabricated to have one or more layers of substantially crystalline semiconductor material. For example, the highest efficiency photovoltaic solar cells presently known are III-V multi-junction cells epitaxially grown on single crystal Ge or GaAs substrates. Similarly, very high efficiency solid state lighting devices such as light emitting diodes (LEDs) and diode lasers may be fabricated from epitaxially grown nitride semiconductors such as InGaN.

Known techniques for the preparation of many crystalline semiconductor materials allow substantial defects during the epitaxial growth process which may compromise device performance. For example, there presently exists a major problem with LEDs and lasers based upon selected crystalline InGaN alloys. In particular, devices prepared from InGaN alloys have low efficiency when the alloy is selected to emit light at wavelengths between approximately 500 nm and 600 nm, corresponding to what is known as the "green gap." One possible cause of this efficiency problem is the material quality of InGaN alloys having a suitable bandgap for emission in this wavelength region. Suitable alloys may be degraded due to a tendency toward phase separation of the InGaN prepared by conventional techniques. One possibility for avoiding this serious problem is the epitaxial growth of lattice-matched InGaN alloys in which phase separation can be suppressed. Unfortunately, no suitable substrates for the lattice matched epitaxial growth of InGaN alloys having band gaps suitable for emission in the "green gap" are known.

A similar problem exists regarding other types of semiconductor devices. A device designer may desire a crystalline semiconductor layer having specific band gap or other characteristics. It may be determined that a specific semiconductor alloy will exhibit the desired characteristics. No suitable substrate exists however, for the lattice matched growth of high quality crystalline material having the desired characteristics. Alternatively, a suitable substrate may exist but be prohibitively expensive for large scale device preparation.

For example, a significant obstacle to the widespread deployment of high efficiency, large surface area, semiconductor devices such as crystalline III-V multi junction photovoltaic cells is the extremely high cost of a suitable growth substrate. In particular, the cost of suitable quantities of single-crystal GaAs or Ge substrate can be prohibitive if the cells are prepared in quantity. Since the cost of a single crystal substrate is prohibitive, a III-V multi-junction cell may be based upon polycrystalline device layers. The inclusion of polycrystalline layers may however limit device performance.

To overcome the inefficiencies associated with polycrystalline layers, it is known in the prior art to fabricate large area, substantially crystalline, semiconductor devices beginning with a relatively inexpensive crystalline substrate which is not well lattice matched to the ultimate device layer. The fabrication of devices under these conditions typically involves several intermediate fabrication steps including the growth of several buffer layers between the substrate and the semiconductor alloy layer of interest. In particular, the need for nearly perfect lattice match between the final buffer layer and the active semiconductor layer may require a large number of buffer layers which are carefully graded to transition from the substrate lattice parameter to the lattice parameter of the active layer. This technique for obtaining an approximate lattice match between each sequentially applied layer is known as a "graded buffer layer" approach. With a graded buffer layer approach, the number of buffer layers that must be grown depends upon both the extent of lattice mismatch between the final active semiconductor layer and the substrate, and the extent of intermediate lattice mismatch which can be accepted.

Buffer layers may also be grown between the substrate and active layer to provide a chemical barrier. A chemical barrier may be needed to prevent diffusion of potentially contaminating elements from the dissimilar substrate into the semiconductor layer(s). The use of one or more buffer layers between the substrate and active semiconductor layer(s) may introduce fabrication problems. In addition, additional processing steps may increase overall device cost. Furthermore, the buffer layers themselves may introduce impurities, defects or strain issues which negatively affect device performance.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

One embodiment is a method of fabricating a semiconductor layer. The method includes providing a substrate having a crystalline surface with a known lattice parameter (a). The method further includes growing a crystalline semiconductor layer on the crystalline substrate surface by coincident site lattice matched epitaxy, without any buffer layer between the crystalline semiconductor layer and the crystalline surface of the substrate. The crystalline semiconductor layer will be prepared to have a lattice parameter (a') that is related to the substrate lattice parameter (a). The lattice parameter (a') maybe related to the lattice parameter (a) by a scaling factor derived from a geometric relationship between the respective crystal lattices. For example, the relationship between (a) and (a') may be, but is not required to be one of the following:

| | | |
|---|---|---|
| (a') = (a)/2 | (a') = (a)/√2 | (a') = (a)/√6 |
| (a') = 2(a) | (a') = (a)√6/2 | (a') = (a)√3/√2 |
| (a') = 2(a)/√3 | (a') = (a)√6 | (a') = (a)√3/2√2 |
| (a') = (a)/√3 | (a') = (a)√2/√3 | (a') = (a)√3/2 |
| (a') = (a)√3 | (a') = 2(a)√2/√3 | (a') = (a)√3 |
| (a') = (a)√3/2 | (a') = 2(a)/√6 | (a') = (a)/√3 |
| (a') = 2(a)√2 | | (a') = 2(a)/√3 |

In one embodiment, the method of fabricating a semiconductor layer may further include providing a substrate having a hexagonal family crystalline structure. In this embodiment the crystalline semiconductor layer may be grown on the {0001} plane of the hexagonal substrate. The semiconductor layer grown on the hexagonal family crystalline substrate surface may also have a hexagonal family crystalline structure. For example, the semiconductor layer may be a Group III-nitride alloy of the wurtzite crystal form. More specifically the semiconductor layer may be an InGaN alloy.

In some hexagonal layer on hexagonal substrate embodiments, the crystalline lattice of the semiconductor layer will not be rotated with respect to the lattice of the substrate. In other embodiments, the lattice of the semiconductor layer may be rotated 30° with respect to the lattice of the substrate.

In another embodiment, the method includes fabricating a cubic crystalline semiconductor layer on the hexagonal family substrate. More specifically, the semiconductor layer may have a face centered cubic based structure. The cubic crystalline semiconductor layer may be, but is not limited to a Group IV semiconductor, a Group II-VI semiconductor, a Group III-V semiconductor, alloys of Group IV semiconductors, alloys of Group II-VI semiconductors or alloys of Group III-V semiconductors. The lattice of the cubic crystalline semiconductor layer may be un-rotated with respect to the hexagonal lattice of the substrate; alternatively, the lattice of the cubic crystalline layer may be rotated 30° with respect to the substrate.

Alternative embodiments includes providing a substrate having a cubic crystal structure, and growing the crystalline semiconductor layer on the {111} plane of the cubic substrate. The cubic crystalline substrate may have a spinel structure, for example, $MgAl_2O_4$, or other cubic structure including but not limited to diamond structure, zincblende structure or other cubic structure. The substrate may be, but is not required to be a Group IV semiconductor, a Group II-VI semiconductor, a Group III-V semiconductor, and alloys of Group IV semiconductors, Group II-VI semiconductors or alloys of Group III-V semiconductors.

Selected embodiments include growing a crystalline semiconductor layer having a wurtzite structure on the cubic substrate. For example, a Group III-nitride alloy may be grown on the {111} plane of the cubic substrate. More specifically, the Group III-nitride alloy may be an InGaN alloy. In this embodiment, the wurtzite lattice of the semiconductor layer may be rotated 30° with respect to the lattice of the cubic substrate.

Alternatively, a semiconductor layer having a cubic crystalline structure may be grown on the (111) plane of a cubic substrate. More specifically, the semiconductor layer may have a face centered cubic structure of the zincblende form. For example, the semiconductor layer may be a Group II-VI semiconductor alloy or a Group III-V semiconductor alloy. The cubic lattice of the semiconductor layer may be rotated 30° with respect to the lattice of the substrate.

In alternative embodiments, the semiconductor layer may be a polar material grown on a polar substrate. In addition, the method may include providing a substrate having a known coefficient of thermal expansion and growing a semiconductor having a coefficient of thermal expansion selected to correspond to the substrate coefficient of thermal expansion.

Alternative embodiments include methods of fabricating a semiconductor device. The device fabrication methods feature the growth of at least one crystalline semiconductor layer on a crystalline substrate surface as described above by coincident site lattice matched epitaxy, without any buffer layer between the semiconductor layer and the surface of the substrate. One or more subsequent semiconductor layers may similarly be grown by coincident site epitaxy on the first or subsequent semiconductor layers. The subsequent layers may also be grown without any buffer between previous and subsequent layers.

Further embodiments include electronic devices having a substrate with a crystalline surface and at least one crystalline semiconductor layer grown on the substrate or another layer by coincident site lattice matched epitaxy, without any buffer layer between the semiconductor layer and the growth surface as described above. The device may be, but is not limited to, a solid state lighting device, for example a light emitting diode (LED), a solid state laser, a photovoltaic device, for example a solar cell, a transistor, a sensor or other semiconductor device.

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

FIG. 1 is a schematic illustration of the unit cells of the three space lattice types of the cubic crystal system;

FIG. 2*a* is a schematic illustration of a (111) plane of a face centered cubic crystal structure;

FIG. 2*b* is a schematic illustration of the atomic arrangement in a (111) plane of a cubic crystal system;

FIG. 3*a* is a schematic illustration of the unit cell of a simple hexagonal crystal structure;

FIG. 3*b* is a schematic illustration of the atomic arrangement in a (0001) plane of a hexagonal crystal family unit cell;

DESCRIPTION

Figure 1:
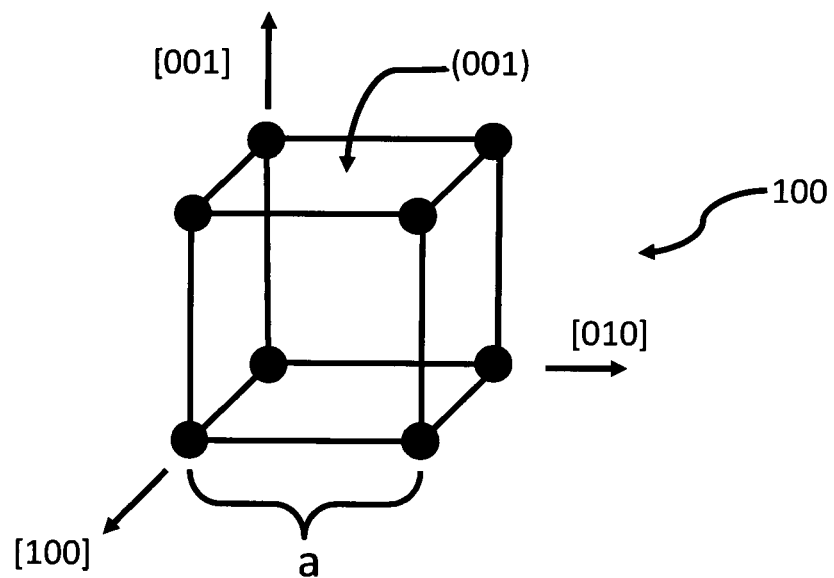
Figure 1:
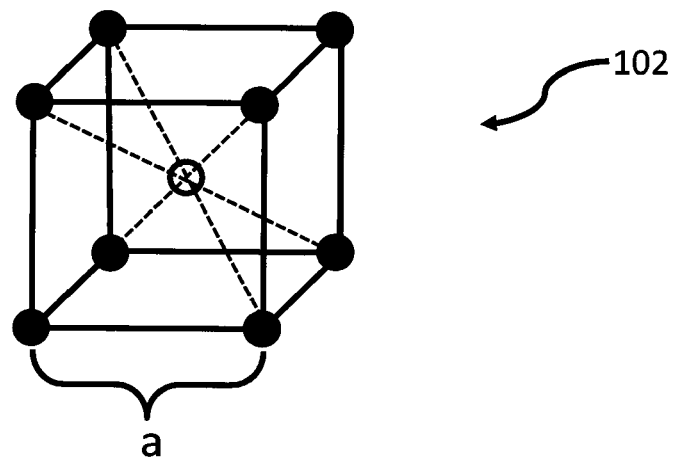
Figure 1:
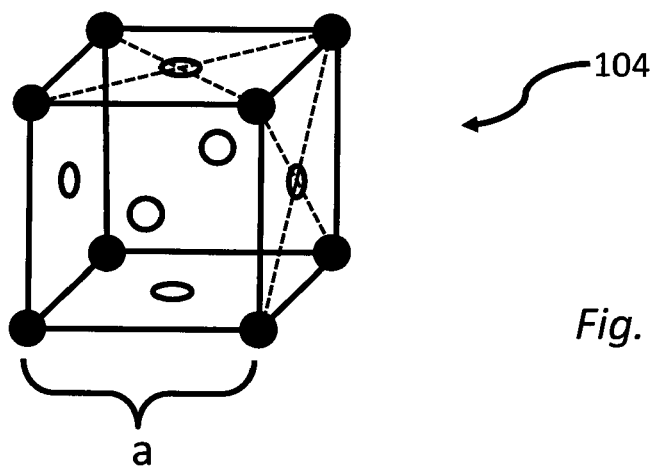

Unless otherwise indicated, all numbers expressing quantities of ingredients, dimensions, reaction conditions and so forth used in the specification and claims are to be understood as being modified in all instances by the term "about."

In this application and the claims, the use of the singular includes the plural unless specifically stated otherwise. In addition, use of "or" means "and/or" unless stated otherwise. Moreover, the use of the term "including," as well as other forms, such as "includes" and "included," is not limiting. Also, terms such as "element" or "component" encompass both elements and components comprising one unit and elements and components that comprise more than one unit unless specifically stated otherwise.

A material may be described herein as being "single crystal." Single crystal very specifically means an ingot, wafer or epilayer that is truly a single crystal, with no grain boundaries. "Crystalline" is a more general term for a substantially crystalline material which can have grain boundaries. Crystalline shall be understood to mean substantially crystalline, and having sufficiently well developed crystal structure that one skilled in the art would refer to the material as being crystalline. The terms single crystal and crystalline do not mean absolutely defect free. Both types of material will have defects and or dislocations.

Certain abbreviations may be made herein with respect to the description of semiconductors and semiconductor alloys. These abbreviations shall not be construed as limiting the scope of the disclosure or claims. For example, the form "InGaAlN" is a common abbreviation to improve readability in technical manuscripts. Abbreviated forms such as "InGaAlN" are defined as equivalent to an expanded form, for example; "$In_xGa_yAl_{1-x-y}N$".

High quality crystalline semiconductor layers which are relatively free of defects may be epitaxially grown on a proper substrate by known techniques. One variable which directly affects the ability to grow a relatively defect free crystalline semiconductor layer is the degree of lattice match between the desired semiconductor material and the substrate. For example, it is somewhat easier to epitaxially grow crystalline Si on a substantially pure crystalline Si substrate than it is to grow crystalline Si on a dissimilar material because of the near perfect lattice match between the substrate and the semiconductor layer in the former case.

Similarly, high efficiency III-V multi-junction solar cells have been epitaxially grown on single crystal Ge or GaAs substrates. The main barrier to the more widespread deployment of these or other highly efficient photovoltaic cells is high fabrication cost. A substantial portion of the total fabrication cost for such a device is the cost of a suitable single crystal substrate. It may also be noted that certain alloys which would be quite useful if prepared in a relatively defect free crystalline form can not be readily prepared at all since these materials have no readily available lattice-matched substrate which may be used as the basis for an epitaxially prepared device layer. InGaN alloys are a representative example of this type of material. In particular, no suitable lattice-matched substrate for the preparation of selected InGaN alloys desirable for use in solid state lighting applications is known.

Accordingly, the various embodiments disclosed herein may be broadly categorized as crystalline semiconductor layers, devices and methods of fabricating crystalline semiconductor layers and devices where one or more layers is prepared by employing coincident site lattice matched epitaxy to grow a crystalline semiconductor layer directly on a crystalline substrate which might be an inexpensive substrate. Certain embodiments disclosed herein include devices and methods of fabricating layers or devices where the semiconductor layer is grown by coincident site lattice matched epitaxy on a substrate where suitable substrates were previously unknown or otherwise resulted in production difficulties.

As used herein, epitaxy, epitaxial and epitaxially are generally defined as relating to the process where one crystalline substance is grown or deposited on another crystalline substance in an ordered manner. Depending upon the structure of the material grown and the substrate, an epitaxial process may feature more or less of a lattice match between a layer and the growth substrate. As used herein in relation to epitaxial processes, "grown" and "grow" are synonymous with "deposited" and "deposit." Heteroepitaxy is a kind of epitaxy performed with materials that are different from each other. The methods disclosed herein involve heteroepitaxy. Various techniques are known for causing epitaxial growth, including but not limited to vapor-phase epitaxy (VPE), liquid phase epitaxy (LPE), molecular beam epitaxy (MBE), metal organic chemical vapor deposition (MOCVD) and others. The methods disclosed herein are not limited to any particular epitaxy method. The more specific phrase "coincident site lattice matched epitaxy" is defined as heteroepitaxy where there is a high degree of lattice match between the substrate and epitaxially grown layer(s), however the lattice match will be a rotated or scaled lattice match as described herein.

The disclosed device or method embodiments will include at least one crystalline semiconductor layer grown through coincident site lattice matched epitaxy directly on a crystalline substrate, without any buffer layer(s) between the semiconductor alloy layer and the crystalline surface of the substrate. To achieve lattice matched epitaxial growth under these circumstances, the semiconductor alloy and the substrate must have lattice parameters that are geometrically related to each other. FIGS. 4-9 described in detail below represent a non-exclusive sampling of alternative lattice parameter relationships where coincident site lattice matched epitaxy may occur, although the epitaxially grown semiconductor material and the substrate do not share the same lattice parameter. The FIGS. 4-9 examples relate to a hexagonal layer grown on a hexagonal substrate, but the geometry described therein is applicable to cubic and mixed hexagonal/cubic systems as well.

A lattice parameter is customarily defined and used herein as the length between unit cells in a crystal lattice. For example, FIG. 1 schematically illustrates unit cells of the three space lattice types of the cubic crystal system. These unit cells include a simple cubic (sc) cell 100, a body centered cubic (bcc) cell 102 and a face centered cubic (fcc) cell 104. In each case the lattice parameter (a) is equal to the distance between adjacent atoms which define the corners of the cubic unit cell. The geometry of a unit cell is also typically described by vector nomenclature known as Miller Indices. For example, as shown on FIG. 1, the Miller indices for the lattice axes of each unit cell (as shown on the simple cubic cell 100) are [100], [001] and [010] as shown. In all cubic lattice systems the direction [h, k, l] defines a vector direction which is normal to the surface of a plane or facet (h, k, l) of interest. Accordingly, in the case of each type of cubic lattice shown on FIG. 1 the (001) plane is at the "top" of the unit cell as illustrated.

Cubic lattices also define lattice planes which are inclined to {100} faces of the basic cubic structure. Of particular importance to the various embodiments described herein are the (111), (111), (111) and (111) planes of cubic cells, illustrated in FIG. 2a with cell 200 that shows a (111) plane. It is customary when describing directions and planes according to Miller indices to write a negative integer as an integer with a bar. Also, the nomenclature {h,k,l} is used to describe the set of all equivalent planes. Thus, the set of (111), (111), (111) and (111) planes may be described collectively as the {111} plane or planes. The atomic arrangement 206 of a {111} plane in a face centered cubic lattice is illustrated in FIG. 2b.

Non-cubic families of crystal lattices include the hexagonal family of crystal structures. As shown in FIG. 3a, the simple hexagonal lattice 300 features each atom having six closest neighbors. With hexagonal lattice systems, it is possible to use a Miller Index which has 4 numbers (h, k, i, l) to describe directions and planes. Of particular interest is the {0001} plane 302. It may be noted from comparison of FIG. 3b with FIG. 2b that the {111} plane of a face centered cubic lattice has the same general atomic arrangement as the {0001} plane of a hexagonal lattice. Both the hexagonal and face centered cubic lattices feature closest-packed arrangements of atoms.

Many crystalline materials, including semiconductor alloys, do not feature equivalently sized atoms at each position in a crystalline lattice. Accordingly, variations in the basic cubic or hexagonal structure will be encountered depending upon the constituent elements of a crystalline material. Of particular interest are the following:

The rock-salt structure. In this structure, each of two atom types forms a separate face-centered cubic sublattice, with the two sublattices interpenetrating so as to form a 3D checkerboard pattern.

The zincblende structure. In this structure the two atom types form two interpenetrating face-centered cubic sublattices. However, it differs from the rock-salt structure in how the two sublattices are positioned relative to one another.

The diamond cubic structure. The diamond cubic structure has an atomic arrangement and bonding the same as the zincblende structure but the two interpenetrating face-centered cubic sublattices contain a single atom type.

The spinel ($MgAl_2O_4$) structure. This is a cubic crystal structure in which the oxygen ions form a face centered cubic lattice.

The fluorite ($CaF_2$) structure. This is a cubic crystal structure in which the calcium ions form a face centered cubic lattice.

The pyrite ($FeS_2$) structure. This is a cubic crystal structure in which the iron atoms form a face centered cubic lattice.

The wurtzite structure, which is the hexagonal analog of the zincblende structure.

The hexagonal close packed (hcp) structure exhibited by many metals.

The tungsten carbide (WC) structure. This is a hexagonal family crystal in which the tungsten atoms form hexagonal close packed planes.

The nickel arsenide (NiAs) structure. This is a hexagonal family crystal in which the nickel atoms form hexagonal close packed planes.

The cadmium iodide ($CdI_2$) structure. This is a hexagonal family crystal in which the iodine atoms form hexagonal close packed planes.

Generally, lattice matched epitaxial growth will only readily occur between materials if the basic crystalline structure and lattice parameter (a) of the respective materials are very similar or identical. Thus, highly lattice matched growth is possible in homoepitaxy, where the substrate and deposited layers are the same crystalline material.

As described in detail above, it would be useful to grow selected semiconductors on relatively inexpensive crystalline substrates. This is particularly true where the desired semiconductor device has a large surface area and would thus require a large surface area substrate which can be prohibitively expensive. Often, the semiconductor materials, layers or alloys of interest do not have a lattice parameter (a') which matches the lattice parameter (a) of any relatively inexpensive and readily available substrate. Selected embodiments disclosed herein therefore feature the use and preparation of a semiconductor alloy to have a lattice parameter (a') which is geometrically related to the substrate lattice parameter (a), but not necessarily by the relationship (a')=(a). For example, various embodiments are disclosed where one or more crystalline semiconductor layers are grown on a dissimilar crystalline substrate by coincident site lattice matched epitaxy where (a')≠(a). No buffer layer is provided between the crystalline semiconductor layer(s) and the substrate. In selected embodiments the lattice of the crystalline semiconductor layer is rotated with respect to the substrate.

Selected embodiments include the growth of a hexagonal crystal semiconductor layer on the {0001} plane of a hexagonal substrate. Alternatively, a hexagonal crystal semiconductor layer may be grown on the {111} plane of a face centered cubic substrate. With rotation of the lattices, a fcc semiconductor layer may be grown on the {0001} plane of a hexagonal substrate or the {111} plane of a fcc substrate. Each of the possibilities summarized above is discussed in detail below.

Figure 4:
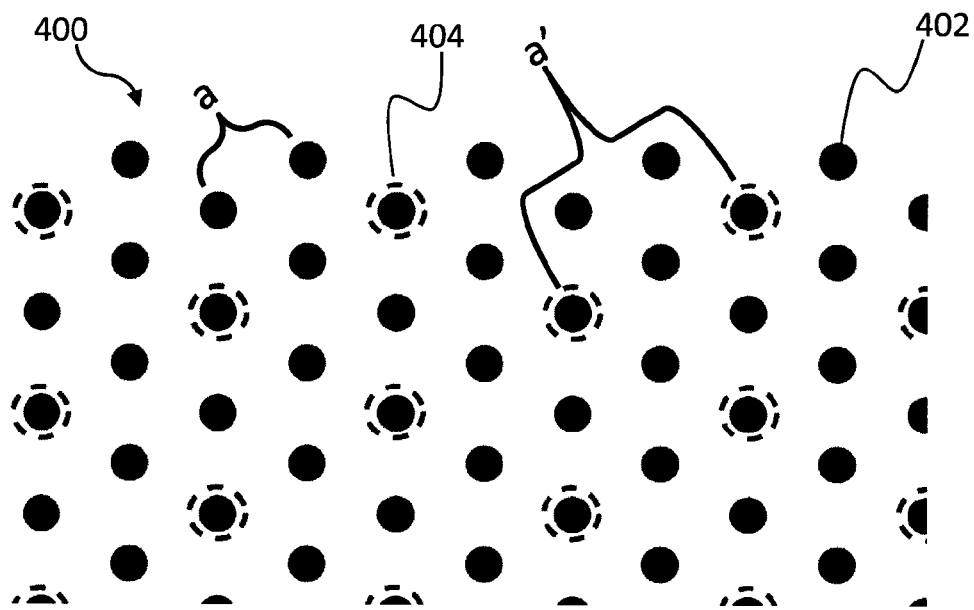
FIG. 4 is a schematic illustration of coincident site lattice matching between a hexagonal substrate having a lattice parameter (a) and a hexagonal semiconductor layer having a lattice parameter (a') where (a)=(a')/2 with no lattice rotation.

One family of systems suitable for the growth of a crystalline semiconductor layer on a crystalline substrate is the growth of a hexagonal family semiconductor, for example a wurtzite layer, on the {0001} plane of a hexagonal crystal substrate. A non-exclusive list of possible coincident site lattice-matching conditions are listed below and illustrated in FIGS. 4-9. In each example, (a) shall be defined as the substrate lattice parameter and (a') shall be defined as the epitaxial semiconductor layer lattice parameter. Coincident site lattice matching may be maintained under conditions including but not limited to:

(a)=(a')/2 with no lattice rotation, as shown in diagram 400 of FIG. 4 where the substrate atoms are represented as black dots 402 and the epitaxial layer atoms are represented as dashed circles 404.

Figure 5:
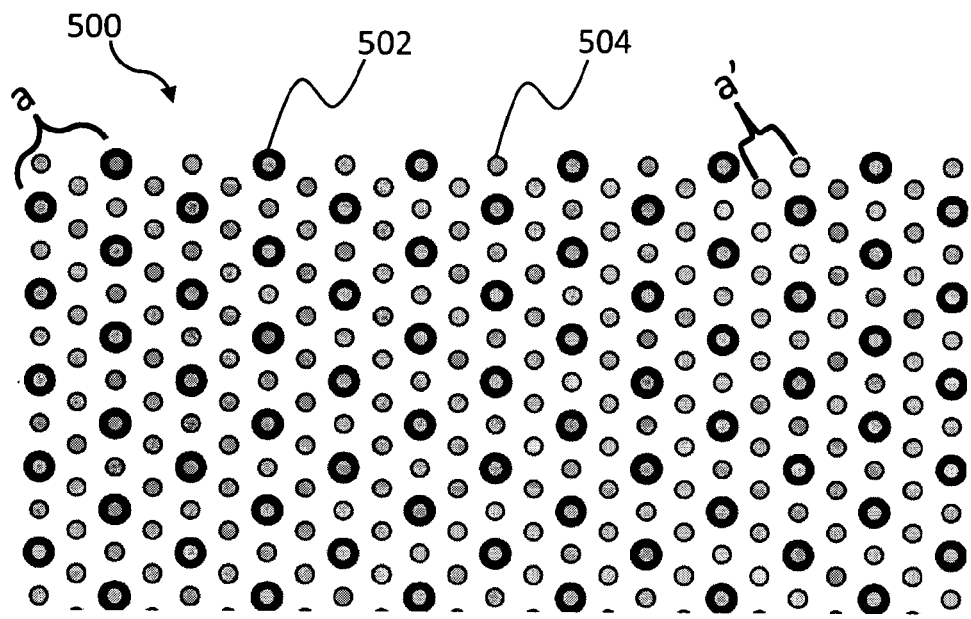
FIG. 5 is a schematic illustration of coincident site lattice matching between a hexagonal substrate having a lattice parameter (a) and a hexagonal semiconductor layer having a lattice parameter (a') where (a)=2(a') with no lattice rotation.

(a)=2(a') with no lattice rotation, as shown in diagram 500 of FIG. 5 where the substrate atoms are represented as black dots 502 and the epitaxial layer atoms are represented as grey dots 504.

Figure 6:
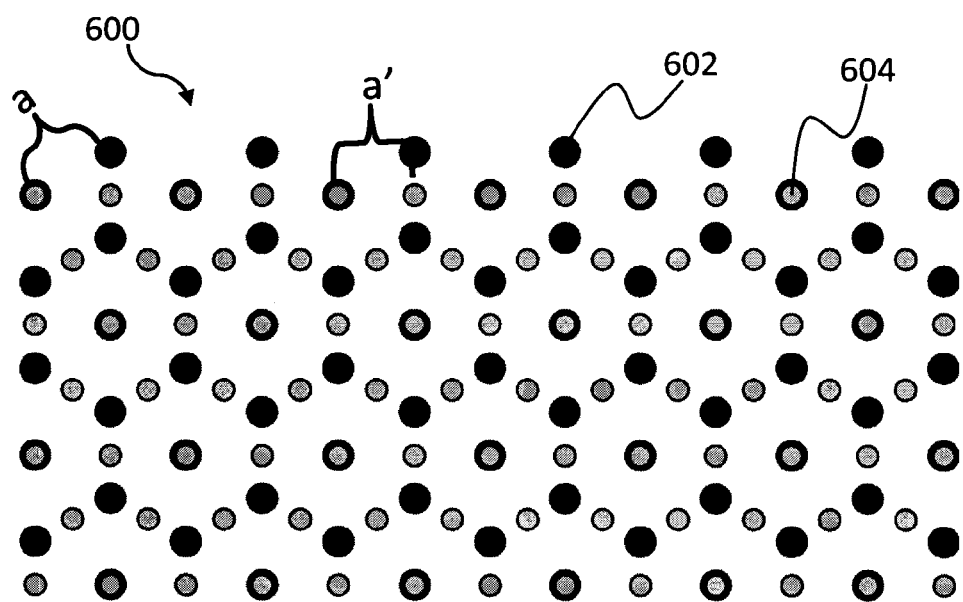
FIG. 6 is a schematic illustration of coincident site lattice matching between a hexagonal substrate having a lattice parameter (a) and a hexagonal semiconductor layer having a lattice parameter (a') where (a)=2(a')/√3 with 30° lattice rotation.

(a)=2(a')/√3 with 30° lattice rotation, as shown in diagram 600 of FIG. 6 where the substrate atoms are represented as black dots 602 and the epitaxial layer atoms are represented as grey dots 604.

Figure 7:
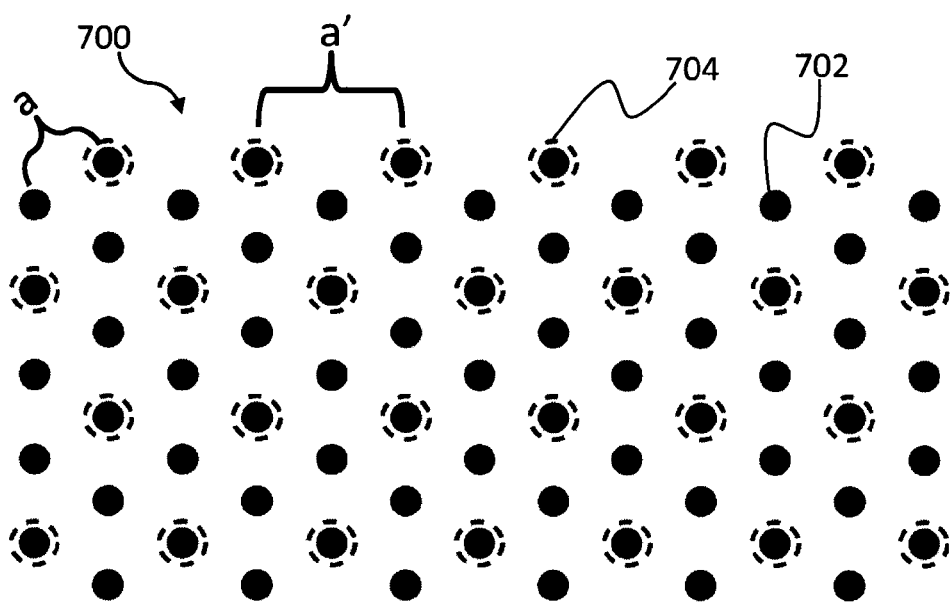
FIG. 7 is a schematic illustration of coincident site lattice matching between a hexagonal substrate having a lattice parameter (a) and a hexagonal semiconductor layer having a lattice parameter (a') where (a)=(a')/√3 with 30° lattice rotation.

(a)=(a')/√3 with 30° lattice rotation, as shown in diagram 700 of FIG. 7 where the substrate atoms are represented as black dots 702 and the epitaxial layer atoms are represented as dashed circles 704.

Figure 8:
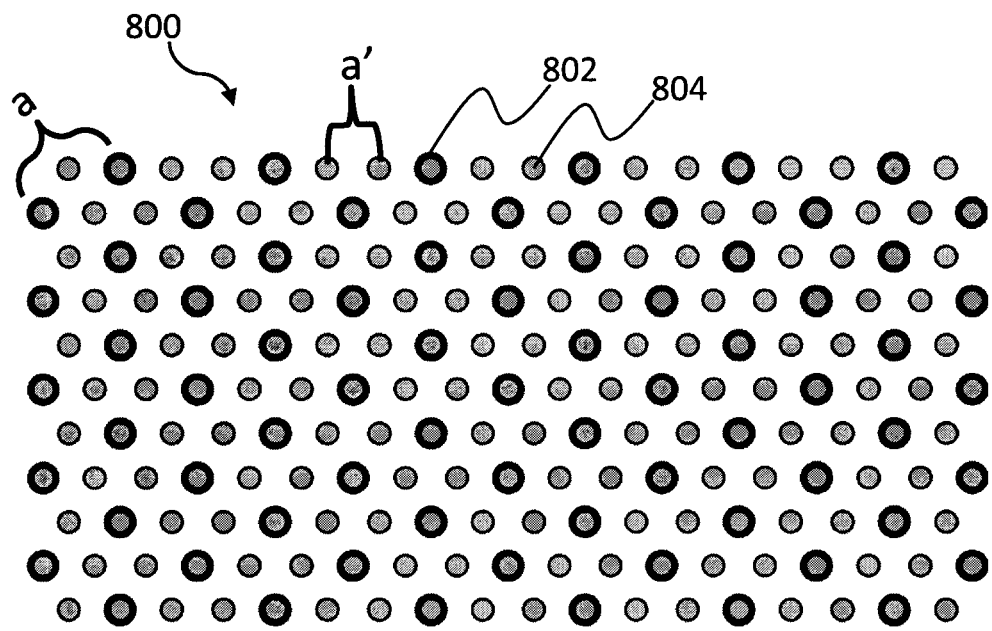
FIG. 8 is a schematic illustration of coincident site lattice matching between a hexagonal substrate having a lattice parameter (a) and a hexagonal semiconductor layer having a lattice parameter (a') where (a)=√3(a') with 30° lattice rotation.

(a)=√3(a') with 30° lattice rotation, as shown in diagram 800 of FIG. 8 where the substrate atoms are represented as black dots 802 and the epitaxial layer atoms are represented as grey dots 804.

Figure 9:
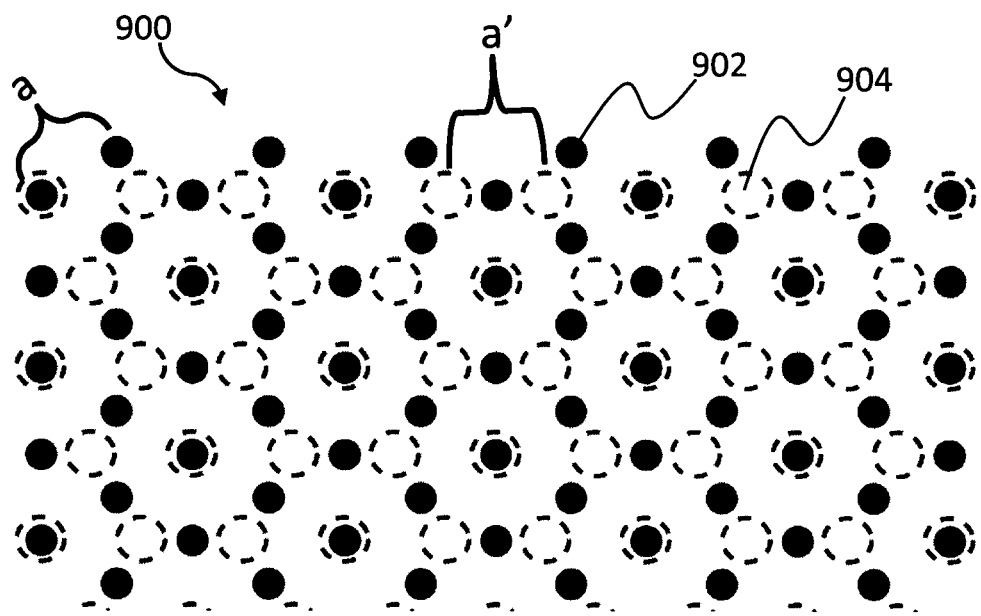
FIG. 9 is a schematic illustration of coincident site lattice matching between a hexagonal substrate having a lattice parameter (a) and a hexagonal semiconductor layer having a lattice parameter (a') where (a)=√3(a')/2 with 30° lattice rotation.

(a)=√3(a')/2 with 30° lattice rotation, as shown in diagram 900 of FIG. 9 where the substrate atoms are represented as black dots 902 and the epitaxial layer atoms are represented as dashed circles 904.

A high degree of coincident site lattice matched epitaxial growth between dissimilar materials can be achieved if the above-noted or similar geometric relationships between the lattice parameter of the semiconductor layer (a') and the lattice parameter of a substrate (a) are maintained. In many cases the lattice parameter of a crystalline semiconductor alloy can be manipulated or adjusted to achieve one of the lattice parameter relationships described herein by varying the concentration of elements within the semiconductor alloy. Alternatively, as described in more detail below, the lattice parameter of the substrate may be adjusted to achieve a proper relationship with the lattice parameter of a selected semiconductor alloy of interest by manipulating the concentration of component elements within a substrate alloy. If desired, both the lattice parameter of the substrate and the semiconductor alloy to be grown thereon may be adjusted.

In addition, the techniques for adjusting a lattice parameter as described herein may be combined with known techniques to prepare a semiconductor alloy to have a selected band gap. The combination of these techniques provides for a method of preparing efficient or otherwise desirable electronic devices having highly crystalline layers through coincident site lattice matched epitaxy. The methods disclosed herein may be implemented without the use of buffer layers between the substrate and semiconductor alloy, thus avoiding potential contamination from the buffer layer, defect generation, layer strain and costs associated with the deposition of buffer layers.

The wurtzite forms of certain Group III-nitride alloys are useful for various solid state light emitting devices. Table 1 below summarizes possible substrate lattice parameters of hexagonal substrates that could be selected to provide coincident site lattice matching on the {0001} substrate plane for selected Group III-nitride alloy layers.

TABLE 1

Substrate lattice parameters for coincident site lattice matching to wurtzite nitride alloys on hexagonal {0001} surfaces.

| Group III-nitride Semiconductor Material | (a') (Å) | 2(a') | (a')/2 | √3(a')/2 | √3(a') | (a')/√3 | 2(a')/√3 |
|---|---|---|---|---|---|---|---|
| GaN (w) | 3.19 | 6.38 | 1.595 | 2.763 | 5.525 | 1.842 | 3.683 |
| InN (w) | 3.55 | 7.1 | 1.775 | 3.074 | 6.149 | 2.05 | 4.099 |
| $In_{0.31}Ga_{0.69}N$ (w) | 3.3 | 6.6 | 1.65 | 2.858 | 5.716 | 1.905 | 3.8105 |
| AlN (w) | 3.11 | 6.22 | 1.555 | 2.693 | 5.387 | 1.796 | 3.591 |

$In_{0.31}Ga_{0.69}N$ is a particularly desirable Group III-nitride alloy as this material has a band gap near middle of "green gap" where known devices are relatively inefficient. Several suitable substrates have been identified which feature lattice parameters consistent with those listed in Table 1. For example, suitable substrates for the coincident site lattice matched growth of $In_{0.31}Ga_{0.69}N$ include but are not limited to those listed in Table 2.

TABLE 2

Some possible hexagonal crystal system substrates identified for coincident site lattice matching with wurtzite $In_{0.31}Ga_{0.69}N$.

| Substrate Material | Lattice parameter (a) (Å) |
|---|---|
| WC | 2.907 |
| La (hcp) | 3.75 |
| ZnS (Wurtzite) | 3.81 |
| CoSb (NiAs) | 3.87 |
| FeTe (NiAs) | 3.8 |
| TiTe (NiAs) | 3.83 |
| $MgBr_2$ ($CdI_2$) | 3.81 |
| $MnBr_2$ ($CdI_2$) | 3.82 |
| $NiTe_2$ ($CdI_2$) | 3.84 |

Similarly, several possible substrates may be identified for the coincident site lattice matched growth of GaN, including but not limited to those listed in Table 3.

TABLE 3

Selected possible hexagonal crystal system substrates for coincident site lattice matching with wurtzite GaN.

| Substrate Material | Lattice parameter (a) (Å) |
|---|---|
| Os (hcp) | 2.74 |
| Re (hcp) | 2.76 |
| Ru (hcp) | 2.70 |
| Y (hcp) | 3.65 |
| Gd (hcp) | 3.64 |
| La (hex) | 3.75 |
| Nd (hex) | 3.66 |
| Pr (hex) | 3.67 |
| CoSe (NiAs) | 3.63 |
| CrSe (NiAs) | 3.68 |
| FeSe (NiAs) | 3.64 |
| MnAs (NiAs) | 3.71 |
| NiAs (NiAs) | 3.60 |
| NiSe (NiAs) | 3.66 |
| $CeBr_2$ ($CdI_2$) | 3.68 |
| $FeBr_2$ ($CdI_2$) | 3.74 |
| $PtSe_2$ ($CdI_2$) | 3.72 |
| $SnS_2$ ($CdI_2$) | 3.64 |

As described above, the {111} plane of a face centered cubic crystal is structurally identical to the {0001} plane of a hexagonal crystalline material. Therefore, it is also possible to grow a fcc based semiconductor layer with coincident site lattice matched epitaxy on a hexagonal family substrate provided that an appropriate geometric relationship between the lattice parameters of the respective materials is maintained.

Several important classes of semiconductor material may be prepared in this fashion. For example, Group II-VI semiconductors, Group III-V semiconductors, Group IV semiconductors, alloys of Group II-VI semiconductors, alloys of Group III-V semiconductors, and alloys of Group IV semiconductors typically exhibit a fcc based crystal structure.

Appropriate coincident site lattice matching may be achieved where the cubic crystalline lattice of the semiconductor layer is un-rotated or rotated 30° with respect to the lattice of the hexagonal family crystalline substrate. Accordingly, the growth of a fcc related semiconductor layer on the {0001} plane of a hexagonal substrate may occur where the relationship between the lattice parameter (a) of the hexagonal substrate and the lattice parameter (a') of the cubic semiconductor layer is selected from the following representative and non-exclusive list:

With no lattice rotation (the <11$\bar{2}$0> hexagonal direction is parallel to <1$\bar{1}$0> cubic direction): (a')=2(a)√2 or (a')=(a)/√2.

With 30° lattice rotation (the <10$\bar{1}$0> hexagonal direction is parallel to <1$\bar{1}$0> cubic direction): (a')=(a)√6/2; (a')=(a)√6; (a')=(a)√2/√3 or (a')=(a)2√2/√3

The most commonly used hexagonal crystal family substrate is sapphire with a lattice parameter (a)=4.758 Å. Cubic semiconductor layers of materials having the lattice parameters listed in Table 4 can be grown with coincident site lattice matched epitaxy on sapphire substrates.

Another possible hexagonal crystal family substrate is quartz with a lattice parameter of 4.916 Å. As shown in column 5 of Table 4, a face-centered cubic based crystal semiconductor with a lattice parameter of 6.021 Å can be grown coincident site lattice matched on a single crystal quartz substrate. Cubic semiconductors that can be fabricated to have a lattice parameter of 6.021 Å include ternary III-V alloys such as $Ga_{0.09}In_{0.91}As$ (direct band gap of ~0.39 eV), $GaAs_{0.17}Sb_{0.83}$ (direct band gap of ~0.637 eV), $Al_{0.09}In_{0.91}As$ (direct band gap of ~0.541 eV), $InAs_{0.80}P_{0.20}$ (direct band gap of ~0.492 eV), $InP_{0.75}Sb_{0.25}$ (direct band gap of ~0.694 eV), and $AlAs_{0.24}Sb_{0.76}$ (indirect band gap of ~1.622 eV) and quaternary III-V semiconductor alloys such as GaInAsP (corresponding to direct band gaps between ~0.39 and ~0.492 eV), GaAlInAs (corresponding to direct band gaps between ~0.39 eV and ~0.541 eV). Other examples include the II-VI semiconductor alloys ZnSTe, ZnSeTe, CdSSe, CdSTe, HgSSe, and HgSTe. Such cubic semiconductor layers could be of interest for a variety of optoelectronic and electronic devices including multi-junction thermophotovoltaic devices, mid-infrared semiconductor lasers and detectors, and high speed transistors.

The final representative example substrate included on Table 4 is wurtzite $In_{0.75}Ga_{0.25}N$ with a direct band gap of

TABLE 4

Lattice parameters of face centered cubic based crystals that can be grown coincident site lattice matched on various hexagonal crystal family substrates.

| Substrate Material | (a) (Å) | 2(a)√2 | (a)/√2 | (a)√6/2 | (a)√6 | (a)√2/√3 | (a)2√2/√3 |
|---|---|---|---|---|---|---|---|
| Sapphire (Al$_2$O$_3$) | 4.758 | 13.46 | 3.364 | 5.827 | 11.655 | 3.885 | 7.77 |
| Quartz (SiO$_2$) | 4.916 | 13.9 | 3.476 | 6.021 | 12.042 | 4.014 | 8.028 |
| In$_{0.75}$Ga$_{0.25}$N | 3.46 | 9.786 | 2.447 | 4.238 | 8.475 | 2.825 | 5.65 |

Several useful possibilities for coincident site lattice matched growth on sapphire are suggested by column 5 of Table 4 and the lattice parameter of 5.827 Å. Face-centered cubic based semiconductor alloys that can be prepared to have lattice parameters of 5.827 Å include ternary III-V alloys such as $Ga_{0.57}In_{0.43}As$ (direct band gap of ~0.849 eV), $GaAs_{0.61}Sb_{0.39}$ (direct band gap of ~0.802 eV), $Ga_{0.10}In_{0.90}P$ (direct band gap of ~1.413 eV), $Al_{0.10}In_{0.90}P$ (direct band gap of ~1.568 eV), $Al_{0.58}In_{0.42}As$ (direct band gap of ~1.77 eV), and $AlAs_{0.65}Sb_{0.35}$ (indirect band gap of ~1.87 eV) and quaternary III-V semiconductor alloys such as GaInAsP (corresponding to direct band gaps between ~0.849 and ~1.413 eV), GaAlInP (corresponding to direct band gaps between ~1.413 eV and ~1.568 eV) and GaAlInAs (corresponding to direct band gaps between ~0.849 eV and ~1.77 eV). Other examples include the II-VI semiconductor CdS (direct band gap of 2.42 eV) and II-VI semiconductor alloys such as ZnSTe, ZnSeTe, and CdZnSe. Such cubic semiconductor layers grown with coincident site lattice matched epitaxy on sapphire substrates could be of interest for a variety of optoelectronic and electronic devices including multi-junction solar cells, semiconductor lasers and detectors, and high speed transistors.

about 1.1 eV. From Table 4, column 8, it can be seen that cubic materials with lattice parameters of about 5.65 Å, for example, GaAs (direct band gap ~1.42 eV) and Ge (indirect band gap ~0.67 eV), can be grown to be coincident site lattice matched on wurtzite $In_{0.75}Ga_{0.25}N$. This would be useful for the fabrication of high efficiency multi-junction solar cells as described in detail below.

A hexagonal or wurtzite semiconductor layer may similarly be grown on the {111} plane of a fcc substrate. As noted above, the {111} plane of a face centered cubic crystal has the same atomic arrangement as the {0001} plane of a hexagonal crystal with the cubic lattice parameter, ($a_c$), equal to √2 times the hexagonal lattice parameter, ($a_h$). Therefore the values of Table 1 may be multiplied by a factor of to provide cubic substrate lattice parameters (a) that are suitable for coincident site lattice matched growth of hexagonal materials, including but not limited to, wurtzite form Group III-nitride alloys. Selected examples of hexagonal semiconductor layers which may be grown on a {111} face centered cubic based substrate are listed in Table 5 below.

TABLE 5

Coincident site lattice matching possibilities for wurtzite nitride alloys on face-centered cubic {111} surfaces.

| Material | (a') (Å) | 2√2(a') | √2(a')/2 | √6(a')/2 | √6(a') | √2(a')/√3 | 2√2(a')/√3 |
|---|---|---|---|---|---|---|---|
| GaN (w) | 3.19 | 9.023 | 2.256 | 3.906 | 7.814 | 2.605 | 5.209 |
| InN (w) | 3.55 | 10.041 | 2.51 | 4.348 | 8.696 | 2.899 | 5.797 |
| $In_{0.31}Ga_{0.69}N$ (w) | 3.3 | 9.334 | 2.333 | 4.042 | 8.083 | 2.694 | 5.389 |
| AlN (w) | 3.11 | 8.796 | 2.199 | 3.809 | 7.618 | 2.539 | 5.079 |

InGaN alloys are useful for the preparation of solid state light emitting devices. A wavelength of 550 nm is in the center of the "green gap" where known devices exhibit relatively poor efficiency. This emission wavelength corresponds to an InGaN alloy with a band gap of about 2.25 eV. For wurtzite InGaN an alloy of composition $In_{0.31}Ga_{0.69}N$ exhibits this band gap and possesses a lattice parameter (a')=3.3 Å. Table 5 shows the lattice parameters of cubic crystal substrates for the coincident site lattice matching of wurtzite III-nitride semiconductors including $In_{0.31}Ga_{0.69}N$ on a {111} growth plane. Table 6 lists some of the possible face-centered cubic based materials with lattice parameters close to those required for coincident site lattice matched epitaxy of $In_{0.31}Ga_{0.69}N$ on a {111} growth plane.

TABLE 6

Selected face-centered cubic based substrates with lattice parameters close to the requirements for coincident site lattice matching with wurtzite $In_{0.31}Ga_{0.69}N$.

| Substrate Material | Lattice parameter (a) (Å) |
|---|---|
| Al (fcc) | 4.05 |
| Au (fcc) | 4.08 |
| Ag (fcc) | 4.09 |
| LiF (rock-salt) | 4.02 |
| VO (rock-salt) | 4.06 |
| $FeS_2$ (pyrite) | 5.38 |
| ZnS (zincblende) | 5.41 |
| Si (diamond) | 5.431 |
| AlP (zincblende) | 5.45 |
| GaP (zincblende) | 5.45 |
| CuCl (zincblende) | 5.41 |
| $CaF_2$ (fluorite) | 5.46 |
| $CdF_2$ (fluorite) | 5.39 |
| $CeO_2$ (fluorite) | 5.41 |
| $CoSi_2$ (fluorite) | 5.36 |
| $NiSi_2$ (fluorite) | 5.40 |
| KF (rock-salt) | 5.35 |
| NaCl (rock-salt) | 5.45 |
| MnSe (rock-salt) | 5.45 |
| $MgAl_2O_4$ (spinel) | 8.08 |
| $CuAl_2O_4$ (spinel) | 8.08 |
| $NiAl_2O_4$ (spinel) | 8.05 |
| $ZnAl_2O_4$ (spinel) | 8.09 |
| $Co_3O_4$ (spinel) | 8.08 |
| $Ni2SiO4$ (spinel) | 8.05 |

As shown in Table 6, several possible materials exist with lattice parameters close to 4.04 Å including the fcc metals Al, Ag, and Au. In addition, a family of alloys with the spinel structure has a lattice parameter close to 8.08 Å. In particular, $MgAl_2O_4$, has a lattice parameter of 8.08 Å and is commercially available as a (111) substrate.

Other face-centered cubic based substrate possibilities for coincident site lattice matching to $In_{0.31}Ga_{0.69}N$ exist with lattice parameters close to 5.39 Å, including several materials with the fluorite and rock-salt crystal structures, as shown in Table 6. Of particular interest are several cubic crystals with the diamond cubic and zincblende crystal structure. These include {111} Si ((a)=5.43 Å), and {111} GaP ((a)=5.45 Å). With Si it may be possible to lattice-match to a hexagonal lattice with $a=a_{si}\sqrt{3}/(2\sqrt{2})=3.326$ Å. This substrate lattice corresponds to a wurtzite InGaN alloy with an In content of 38% having a band gap of about 2.05 eV which in turn corresponds to an emission wavelength of about 600 nm, of great interest for solid state lighting applications.

Wurtzite InGaN layers may also be grown through coincident site lattice matched epitaxy on a GaP substrate, which may have advantages over Si, since anti-phase boundary generation may be avoided by growing a polar semiconductor such as InGaN or any other Group III-V or Group II-VI alloy on a polar substrate. Also, as detailed in Table 7 below, InGaN has a much smaller thermal expansion coefficient mismatch to GaP than to Si. Accordingly, cracking of the InGaN layers may be minimized by growing on GaP. Layer cracking has been a serious problem in previous attempts to grow III-nitride alloys on {111} Si substrates.

TABLE 7

Thermal expansion coefficients of selected crystals.

| Material | Thermal expansion coefficient ($10^{-6}$/K) |
|---|---|
| AlN | 5.27 (for a) |
| GaN | 5.59 (for a) |
| InN | 3.8 (for a) |
| Si | 2.59 |
| Ge | 5.9 |
| GaAs | 6 |
| GaP | 4.65 |

Coincident site lattice matching techniques may also be used to grow {111} face centered cubic lattice semiconductor materials, e.g., diamond cubic or zincblende semiconductors and their alloys, on face-centered cubic lattice based substrates, e.g., diamond cubic or zincblende semiconductors. Some of the possible lattice parameter relationships for the rotated coincident site lattice matched growth of fcc semiconductors on fcc substrates are shown in Table 8.

TABLE 8

Coincident site lattice matching possibilities for zincblende/diamond cubic semiconductor alloys on {111} face-centered cubic surfaces involving a 30° rotation about the <111> growth axis.

| Material | (a) (Å) | √3(a)/2 | √3(a) | (a)/√3 | 2(a)/√3 |
|---|---|---|---|---|---|
| C (diamond) | 3.5668 | 3.089 | 6.178 | 2.059 | 4.119 |
| Si (diamond) | 5.431 | 4.703 | 9.407 | 3.136 | 6.271 |
| Ge (diamond) | 5.6461 | 4.89 | 9.779 | 3.26 | 6.52 |
| AlP (ZB) | 5.451 | 4.721 | 9.441 | 3.147 | 6.294 |
| GaP (ZB) | 5.451 | 4.721 | 9.441 | 3.147 | 6.294 |
| GaAs (ZB) | 5.6533 | 4.896 | 9.792 | 3.264 | 6.528 |
| AlAs (ZB) | 5.661 | 4.903 | 9.805 | 3.268 | 6.5368 |

TABLE 8-continued

Coincident site lattice matching possibilities for zincblende/diamond cubic semiconductor alloys on {111} face-centered cubic surfaces involving a 30° rotation about the <111> growth axis.

| Material | (a) (Å) | √3(a)/2 | √3(a) | (a)/√3 | 2(a)/√3 |
|---|---|---|---|---|---|
| InP (ZB) | 5.8686 | 5.082 | 10.165 | 3.388 | 6.776 |
| InAs (ZB) | 6.0584 | 5.247 | 10.493 | 3.4978 | 6.996 |
| GaSb (ZB) | 6.0959 | 5.279 | 10.559 | 3.519 | 7.039 |
| AlSb (ZB) | 6.1355 | 5.313 | 10.627 | 3.542 | 7.085 |
| InSb (ZB) | 6.4794 | 5.611 | 11.22 | 3.741 | 7.482 |
| ZnS (ZB) | 5.42 | 4.694 | 9.388 | 3.129 | 6.258 |
| ZnSe (ZB) | 5.668 | 4.909 | 9.817 | 3.272 | 6.545 |
| ZnTe (ZB) | 6.104 | 5.286 | 10.572 | 3.524 | 7.048 |
| CdS (ZB) | 5.832 | 5.051 | 10.101 | 3.367 | 6.734 |
| CdSe (ZB) | 6.05 | 5.24 | 10.479 | 3.493 | 6.986 |
| CdTe (ZB) | 6.482 | 5.614 | 11.227 | 3.742 | 7.485 |
| HgS (ZB) | 5.851 | 5.067 | 10.134 | 3.378 | 6.756 |
| HgSe (ZB) | 6.084 | 5.269 | 10.538 | 3.513 | 7.025 |
| HgTe (ZB) | 6.461 | 5.595 | 11.191 | 3.73 | 7.461 |

Some of the most interesting possibilities occur where (a')=√3(a)/2 or (a')=2(a)/√3, as reflected in columns 3 and 6 of Table 8. For example, coincident site lattice matching can be achieved with a fcc semiconductor grown on the {111} surface of a diamond cubic Si substrate lattice where the semiconductor layer has a lattice parameter of 6.271 Å.

Also from Table 8, it can be seen that several II-VI and III-V semiconductor alloys can be selected to substantially match this lattice parameter. For example, selected Group II-VI alloys such as $Cd_{0.44}Zn_{0.56}Te$ with a direct band gap of about 1.9 eV, $CdSe_{0.49}Te_{0.51}$ with a direct band gap of about 1.4 eV, and $CdS_{0.32}Te_{0.68}$ with a direct band gap of about 1.44 eV will have a lattice parameter (a') of about 6.27 Å. These II-VI alloys could be used to potentially produce high efficiency multi-junction solar cells on low cost, large area, single crystal {111} Si substrates with the Si substrate potentially forming a 1.1 eV low band gap bottom junction.

A further example is the growth of Group III-Sb alloys such as $InAs_{0.495}Sb_{0.505}$ (direct band gap ~0.084 eV), on Si using the (a')=2(a)/√3 condition with a 30° lattice rotation. Other possible semiconductor layers include: $Ga_{0.54}In_{0.46}Sb$ (direct band gap ~0.371 eV); $Al_{0.61}In_{0.39}Sb$ (indirect band gap ~1.301 eV); and $InP_{0.34}Sb_{0.66}$ (direct band gap ~0.148 eV). Because of the high carrier mobilities observed for narrow band gap alloys such as InAsSb, these III-Sb alloys grown by coincident site lattice matching on Si substrates could be of great interest for very high-speed transistors. Group III-Sb alloys are also of interest for narrow band gap (long wavelength) detector applications.

Growth of semiconductor layers through coincident site lattice matched epitaxy as described herein can provide ancillary device fabrication benefits and device fabrication flexibility. For example, by growing thin coincident site lattice-matched wurtzite InGaN quantum well devices on {111} Si or GaP substrates it may be possible to use quantum confinement to reach the required band gap of ~2.25 eV for devices emitting in the middle of the "green gap" of poor efficiency for LEDs. Wurtzite InGaN of band gap ~2.05 eV may also be of interest for a high band gap solar cell for use in spectrum splitting approaches to multi junction solar cells. It may be possible to grow such coincident site lattice-matched InGaN 2.05 eV junction solar cells without graded lattice parameter buffer layers on (111) Si substrates that are cheap and widely available.

Figure 10:
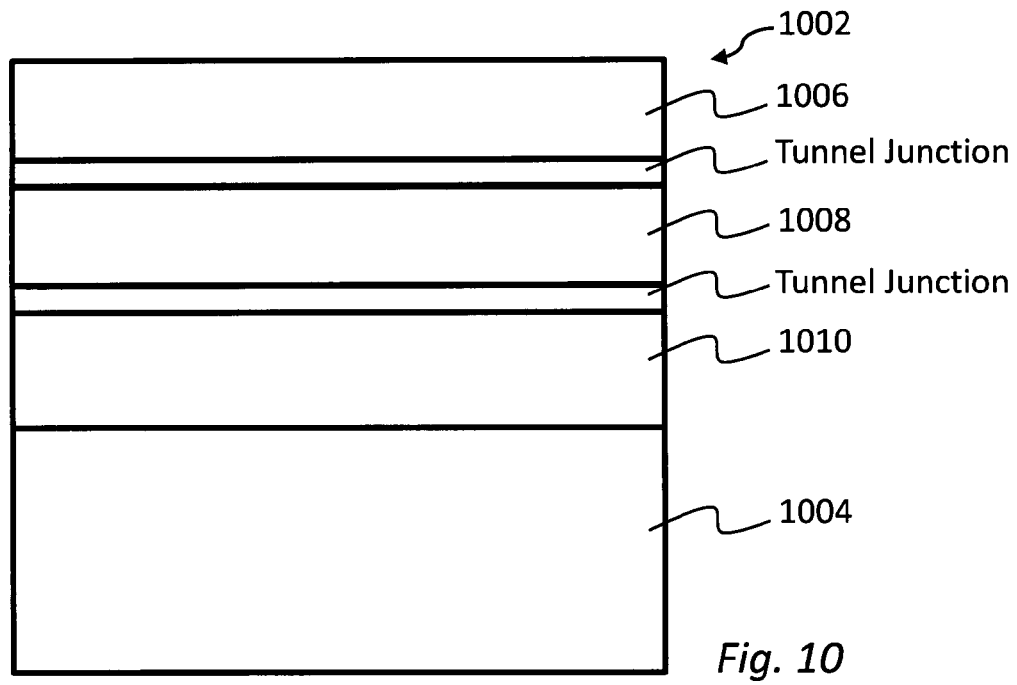
FIG. 10 is a schematic illustration of a prospective solar cell device fabricated according to the methods disclosed herein.

Ge and GaAs with lattice parameters of ~5.65 Å may be particularly well suited for use as substrates according to the techniques disclosed herein. These materials can be coincident site lattice-matched to a hexagonal lattice $a=a_{Ge}\sqrt{3}/(2\sqrt{2})$ or about 3.46 Å. This corresponds to a wurtzite InGaN alloy with an In content of about 75%. This alloy has a band gap of about 1.1 eV. As illustrated in FIG. 10, this alloy would be useful for a very high efficiency triple junction solar cell 1002 grown coincident site lattice-matched on {111} GaAs or Ge substrates 1004 the cell having junctions with band gaps of about 1.1 eV (wurtzite InGaN) 1006, 1.42 eV (zincblende GaAs) 1008, and 1.91 eV (zincblende GaInP) 1010. Such a band gap combination is predicted to have a maximum solar cell efficiency of close to 50% under the 500× concentrated AM1.5D spectrum.

World record efficiency triple junction solar cells have previously been grown in an inverted metamorphic (lattice-mismatched) structure with the two high band gap junctions grown first, lattice-matched to the substrate (typically (001) GaAs or Ge), and the third low band gap junction grown lattice-mismatched after the growth of several graded lattice parameter buffer layers to reduce the threading dislocation density. The need for such graded buffer layers is costly in terms of material and growth time, in addition, residual strain in the structures could be detrimental to the long-term reliability of the cells. According to the techniques disclosed herein, it may be possible to grow an inverted "lattice-matched" triple junction solar cell such as cell 1002 where the two high band gap junctions (1008, 1010) are deposited first on a {111} GaAs or Ge substrate 1004 and then the third low band gap wurtzite InGaN junction 1006 is deposited last without the need to grow graded lattice parameter buffer layers, as shown in FIG. 10. After growth of the required device layers, the substrate may be removed and potentially be reused. The remaining cell structure may be inverted and bonded to a handle material.

Growth on {111} GaAs substrates has several advantages including: (i) preventing the formation of antiphase boundaries that may arise with growth on Ge substrates; (ii) allowing the lattice-matched GaInP high band gap junction to be grown without the occurrence of CuPt atomic ordering resulting in a higher top cell band gap (this reduces the need to thin the top cell in order to allow more light to reach the middle cell, enabling higher overall currents to be achieved); (iii) the use of piezoelectric fields to aid carrier collection; and (iv) avoiding the use of Ge that is expected to seriously limit the large-scale utilization of high efficiency III-V multi-junction solar cells because of its scarcity.

Figure 11:
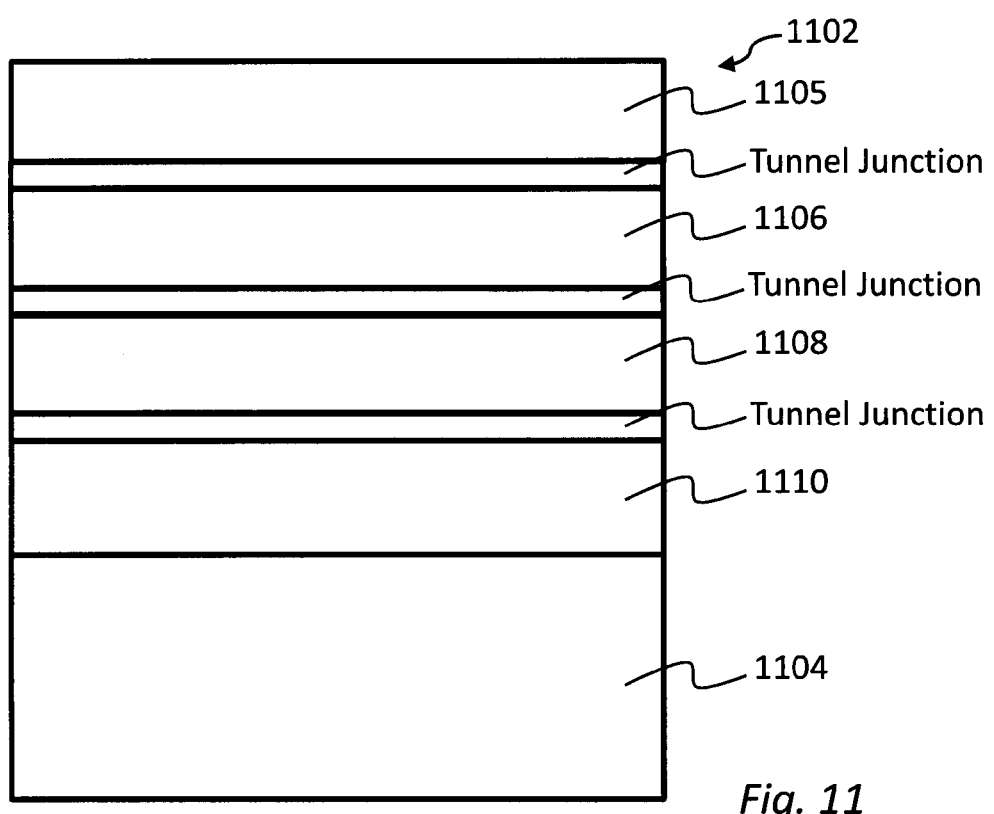
FIG. 11 is a schematic illustration of an alternative prospective solar cell device fabricated according to the methods disclosed herein.

The disclosed techniques may also be implemented to fabricate a four junction solar cell 1102 with high theoretical efficiency (>50%) using the principles of coincident site lattice matching. One representative device configuration is an inverted geometry grown on a {111} Ge or GaAs substrate 1104 as shown in FIG. 11. The representative device 1102 features an epitaxially deposited coincident site lattice-matched Ge junction 1105 on top of a 1.1 eV coincident site lattice-matched wurtzite InGaN junction 1106. The four junction cell 1102 may be completed with two higher band gap junctions; 1.42 eV (zincblende GaAs) 1108, and 1.91 eV (zincblende GaInP) 1110, prepared as described above with respect to FIG. 10.

Figure 12:
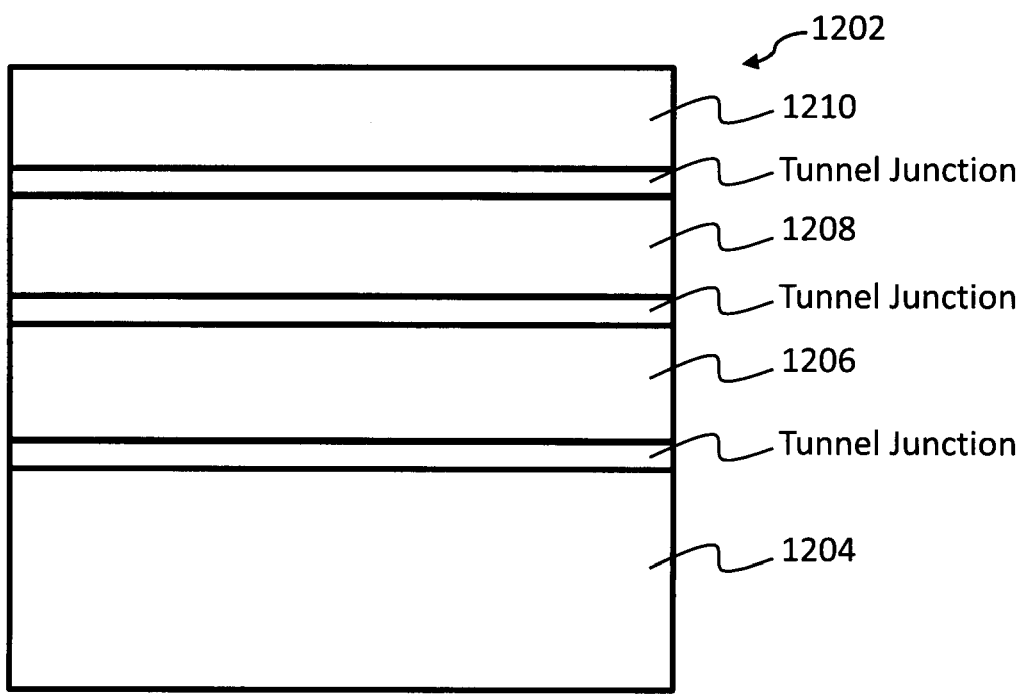
FIG. 12 is a schematic illustration of an alternative prospective solar cell device prepared according to the methods disclosed herein.

Alternatively, if a very high quality coincident site lattice-matched 1.1 eV InGaN is achieved, it may be possible to grow a coincident site lattice-matched four junction structure 1202 in a non-inverted geometry as shown in FIG. 12. The FIG. 12 configuration features a (111) Ge substrate 1204 that also forms the lowest 0.67 eV band gap junction. Subsequent layers prepared by site coincident lattice matched epitaxy include junctions with band gaps of about 1.1 eV (wurtzite InGaN) 1206, 1.42 eV (zincblende GaAs) 1208, and 1.91 eV (zincblende GaInP) 1210. Epitaxial growth of such structures could be by either MBE or MOCVD. Other devices, including but not limited to high temperature/high power transistors in power electronics applications, detectors and other semiconductor based devices may be prepared by the disclosed techniques.

EXAMPLES

The following examples are provided for illustrative purposes only and are not intended to limit the scope of the exemplary method and electronic device.

Example 1

As described above, a coincident site lattice-matching condition exists for growing {0001} wurtzite InGaN alloys with a lattice parameter (a') on the {111} plane of a cubic crystal where the lattice parameter (a) is equal to √6 times (a'). This coincident site lattice-matching configuration involves a lattice rotation of 30° around the <0001>/<111> axis to form a coincident site lattice between the atoms on the {111} plane of the cubic substrate and the atoms on the {0001} plane of the wurtzite crystal. For this epitaxial relationship, the <10-10> direction of InGaN is parallel to the <1-10> direction of the cubic substrate. A device emission wavelength of 550 nm is in the center of the "green gap," a range of wavelengths with low emission efficiency. For nitride based light emitting devices this wavelength corresponds to an InGaN alloy with a band gap of about 2.25 eV. An alloy of wurtzite InGaN having the composition $In_{0.31}Ga_{0.69}N$ has this band gap and possesses a lattice parameter (a')=3.3 Å. This semiconductor alloy can be grown coincident site lattice matched according to the above scheme on the {111} plane of a cubic crystal with a lattice parameter of 8.08 Å. Spinel, $MgAl_2O_4$, was identified as having a lattice parameter of 8.08 Å, as well as being readily commercially available in a {111} substrate form. A series of wurtzite InGaN alloy layers were grown on {111} spinel substrates by molecular beam epitaxy to determine if the required epitaxial alignment occurs.

Figure 13:
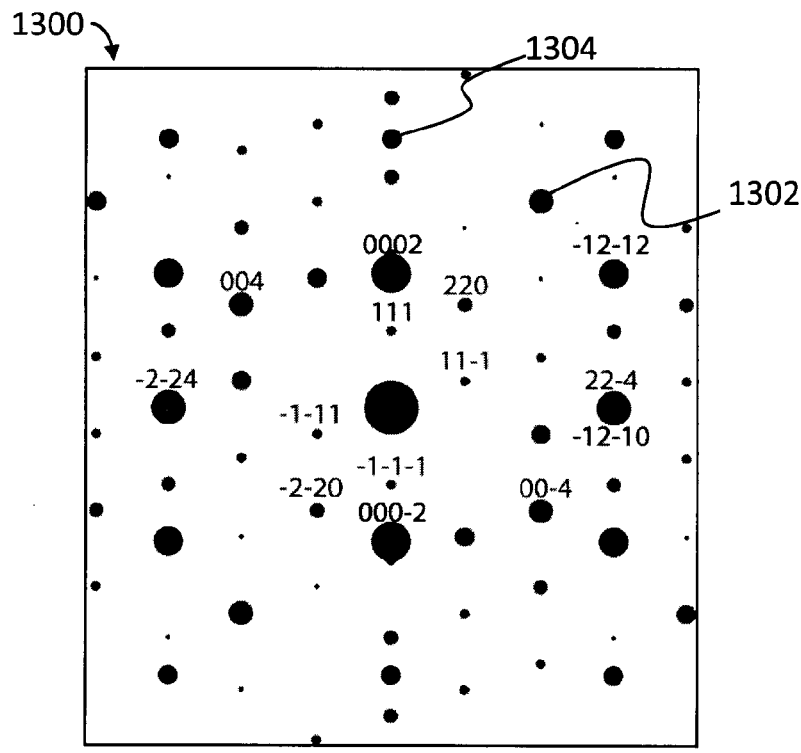
FIG. 13 is an illustration of the predicted transmission electron diffraction pattern for an interface between an InGaN layer grown on a spinel substrate according to the methods described herein.

FIG. 13 illustrates the expected transmission electron diffraction pattern 1300, along the [1-10] spinel direction for an interface between (0001) $In_{0.31}Ga_{0.69}N$ and (111) spinel with the required epitaxial alignment. The spinel diffraction spots 1302 are shaded grey and the InGaN diffraction spots 1304 are black. The lattice spacing of the (22-4) spinel planes exactly matches that of the (-12-10) $In_{0.31}Ga_{0.69}N$ planes across the interface.

Figure 14:
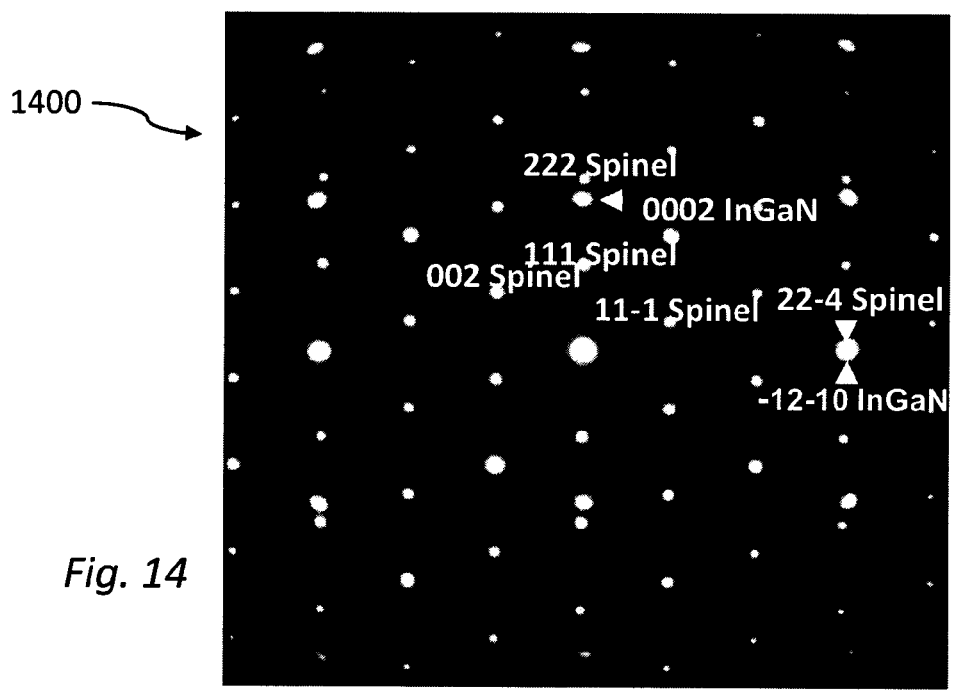
FIG. 14 is an actual transmission electron diffraction (TED) pattern for an interface between an InGaN layer grown on a spinel substrate according to the methods described herein.
Figure 15:
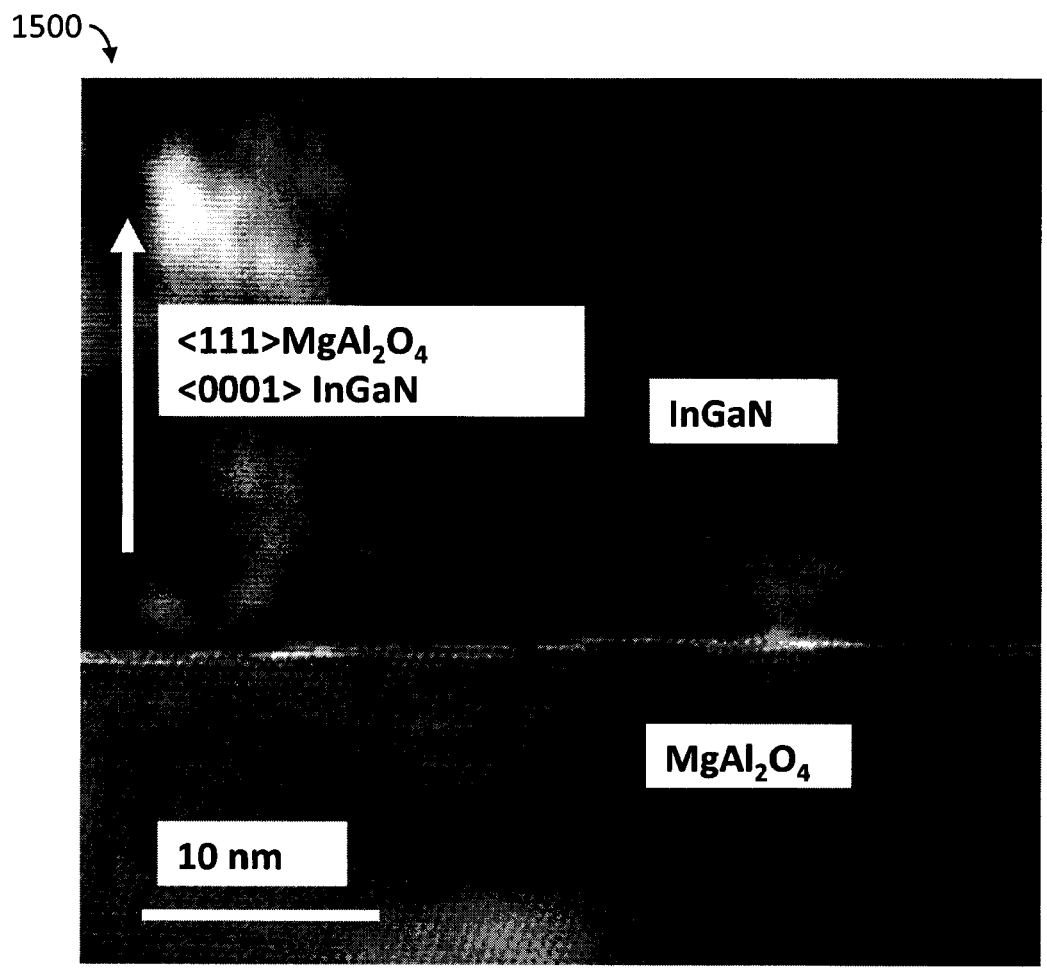
FIG. 15 is a high resolution transmission electron microscope (TEM) image of the interface of FIG. 14.

FIG. 14 shows an experimental transmission electron diffraction (TED) pattern 1400 taken from the InGaN/spinel interface along the [1-10] spinel direction of one of the samples grown as described above. The results illustrated in FIG. 14 reveal that the anticipated epitaxial relationship between the (0001) InGaN and the (111) spinel substrate was obtained and that the InGaN layer composition is very close to the appropriate coincident site lattice-matched value. As shown in FIG. 15, a high-resolution TEM image 1500 reveals epitaxial growth of the wurtzite InGaN on the cubic spinel substrate with a sharp but stepped interface.

Figure 16:
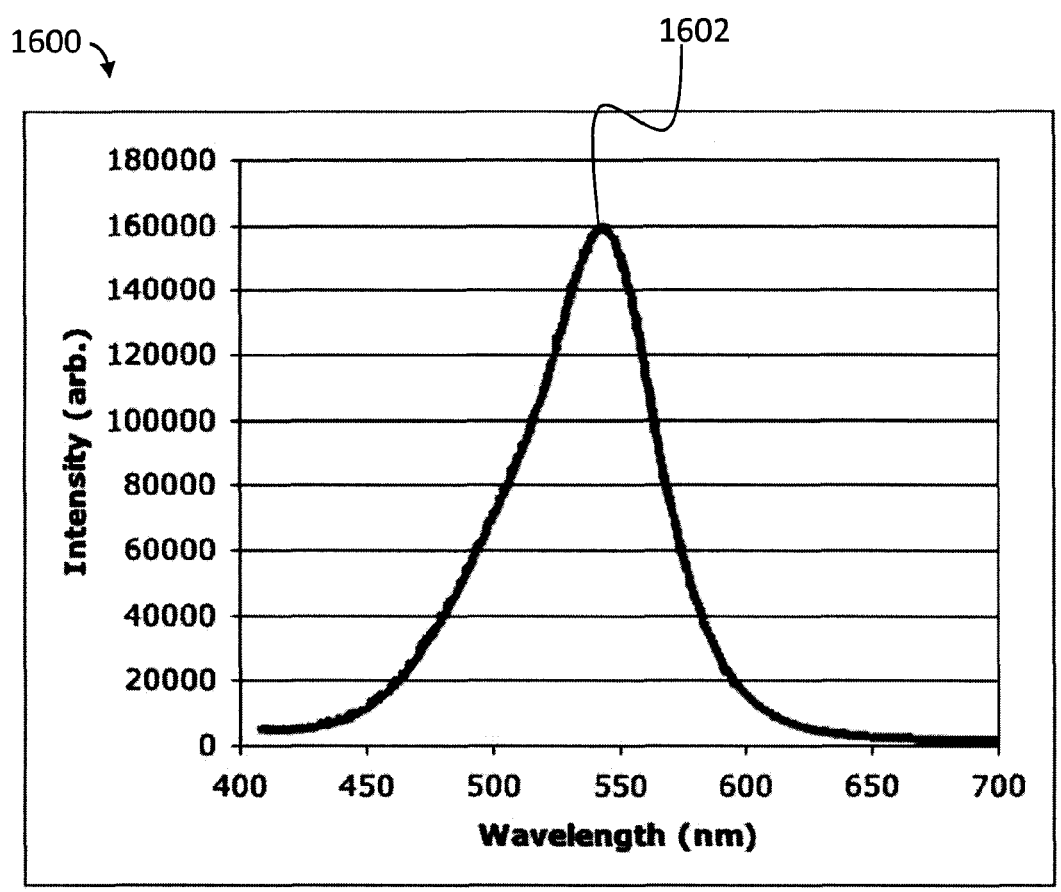
FIG. 16 is a graphic representation of the room temperature photoluminescence of the InGaN semiconductor of FIG. 14.

A graphic representation 1600 of the room temperature photoluminescence of the prepared InGaN alloy sample is shown in FIG. 16. The spectra contains a single intense peak 1602 centered at about 550 nm corresponding to the center of the "green gap" of low efficiency previously reported for nitride based light emitting devices. In conclusion, growth of an InGaN semiconductor alloy layer through rotated coincident site lattice-matched epitaxy on a (111) cubic spinel substrate has been demonstrated. The InGaN fabricated as described herein emits intense PL at about 550 nm wavelength, corresponding to the center of the low efficiency "green gap" indicating suitability for high efficiency solid state light emitting devices.

Various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

While the exemplary method and electronic device has been particularly shown and described with reference to a number of embodiments, it would be understood by those skilled in the art that changes in the form and details may be made to the various embodiments disclosed herein without departing from the spirit and scope of the invention and that the various embodiments disclosed herein are not intended to act as limitations on the scope of the claims. All references cited herein are incorporated in their entirety by reference.

The description of the present exemplary method and electronic device has been presented for purposes of illustration and description, but is not intended to be exhaustive or limiting of the exemplary method and electronic device to the form disclosed. The scope of the present exemplary method and electronic device is limited only by the scope of the following claims. Many modifications and variations will be apparent to those of ordinary skill in the art. The embodiment described and shown in the figures was chosen and described in order to best explain the principles of the exemplary method and electronic device, the practical application, and to enable others of ordinary skill in the art to understand the invention for various embodiments with various modifications as are suited to the particular use contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method of fabricating a semiconductor layer comprising: providing a substrate having a crystalline surface with a known lattice parameter (a), the substrate having a cubic crystal system structure; and growing a crystalline semiconductor layer on a {111} plane of the crystalline substrate surface by coincident site lattice matched epitaxy, without any buffer layer between the crystalline semiconductor layer and the crystalline surface of the substrate, wherein the crystalline semiconductor layer is prepared to have a lattice parameter (a') that is related to the lattice parameter (a).

2. The method of fabricating a semiconductor layer of claim 1 wherein the substrate is $MgAl_2O_4$ having a spinel structure.

3. The method of fabricating a semiconductor layer of claim 1 wherein the substrate has a diamond cubic structure.

4. The method of fabricating a semiconductor layer of claim 3 wherein the substrate is one of C, Si, Ge, Sn and their alloys.

5. The method of fabricating a semiconductor layer of claim 1 wherein the substrate has a zincblende structure.

6. The method of fabricating a semiconductor layer of claim 5 wherein the substrate is one of a group II-VI semiconductor, a group III-V semiconductor, alloys of group II-VI semiconductors and alloys of group III-V semiconductors.

7. The method of fabricating a semiconductor layer of claim 1 further comprising growing a crystalline semiconductor layer which has a wurtzite crystalline structure.

8. The method of fabricating a semiconductor layer of claim 7 further comprising growing a Group III-nitride alloy on the {111} plane of the cubic substrate.

9. The method of fabricating a semiconductor layer of claim 8 wherein the Group III-nitride alloy is an InGaN alloy.

10. The method of fabricating a semiconductor layer of claim 9 wherein the InGaN alloy is $In_{0.31}Ga_{0.69}N$ (w).

11. The method of fabricating a semiconductor layer of claim 10 wherein the substrate is $MgAl_2O_4$.

12. The method of fabricating a semiconductor layer of claim 7 wherein the wurtzite crystalline lattice of the crystalline semiconductor layer is rotated 30° with respect to the lattice of the cubic crystalline substrate.

13. The method of fabricating a semiconductor layer of claim 12 wherein the relationship between the lattice parameter (a) of the substrate and the lattice parameter (a') of the crystalline semiconductor layer is one of, $(a')=2(a)/\sqrt{6}$, $(a')=(a)/\sqrt{6}$, $(a')=(a)\sqrt{3}/\sqrt{2}$ and $(a')=(a)\sqrt{3}/2\sqrt{2}$.

14. The method of fabricating a semiconductor layer of claim 1 further comprising growing a crystalline semiconductor layer which has a cubic crystalline structure on the {111} plane of the cubic substrate.

15. The method of fabricating a semiconductor layer of claim 14 further comprising growing a crystalline semiconductor layer which has a cubic crystalline structure of the diamond cubic form.

16. The method of fabricating a semiconductor layer of claim 15 wherein the crystalline semiconductor layer is one of a Group IV semiconductor and a Group IV semiconductor alloy.

17. The method of fabricating a semiconductor layer of claim 14 further comprising growing a crystalline semiconductor layer which has a cubic crystalline structure of the zincblende form.

18. The method of fabricating a semiconductor layer of claim 17 wherein the crystalline semiconductor layer is one of a Group II-VI semiconductor, a Group III-V semiconductor, a Group II-VI semiconductor alloy, and a Group III-V semiconductor alloy.

19. The method of fabricating a semiconductor layer of claim 14 wherein the cubic crystalline lattice of the crystalline semiconductor layer is rotated 30° with respect to the lattice of the cubic crystalline substrate.

20. The method of fabricating a semiconductor layer of claim 19 wherein the relationship between the lattice parameter (a) of the substrate and the lattice parameter (a') of the crystalline semiconductor layer is one of $(a')=(a)\sqrt{3}/2$, $(a')=(a)\sqrt{3}$, $(a')=(a)/\sqrt{3}$ and $(a')=2(a)/\sqrt{3}$.

21. The method of fabricating a semiconductor layer of claim 1 further comprising:
providing a polar substrate; and
growing a polar crystalline semiconductor on the substrate.

22. The method of fabricating a semiconductor layer of claim 1 further comprising:
providing a substrate having a known coefficient of thermal expansion; and
growing a crystalline semiconductor layer on the substrate which has a coefficient of thermal expansion selected to correspond to the substrate coefficient of thermal expansion.

23. A method of fabricating a semiconductor device comprising: providing a substrate having a crystalline surface with a known lattice parameter (a) and having a cubic crystal system structure; growing a crystalline semiconductor layer on a {111} plane of the crystalline substrate surface by coincident site lattice matched epitaxy, without any buffer layer between the crystalline semiconductor layer and the crystalline surface of the substrate, wherein the crystalline semiconductor layer is prepared to have a lattice parameter (a') that is related to the lattice parameter (a); and epitaxially growing one or more subsequent crystalline semiconductor layers on the first crystalline semiconductor layer.

24. The method of fabricating a semiconductor device of claim 23 further comprising growing a subsequent crystalline semiconductor layers on the crystalline semiconductor layer by coincident site lattice matched epitaxy, without any buffer layer between the subsequent crystalline semiconductor layer and the crystalline semiconductor layer, wherein the subsequent crystalline semiconductor layer is prepared to have a lattice parameter (a')' that is related to the lattice parameter (a').

25. The method of fabricating a semiconductor device of claim 24 wherein the crystalline lattice of the subsequent semiconductor layer is rotated 30° with respect to the lattice of the crystalline semiconductor layer.

26. An electronic device comprising: a substrate having a crystalline surface with a known lattice parameter (a) and a cubic crystal system structure; a crystalline semiconductor layer grown on the crystalline substrate surface by coincident site lattice matched epitaxy, without any buffer layer between the crystalline semiconductor layer and the crystalline surface of the substrate, wherein the crystalline semiconductor layer is prepared to have a lattice parameter (a') that is related to the lattice parameter (a), the crystalline semiconductor layer having a wurtzite crystalline structure.

27. The electronic device of claim 26 wherein the lattice of the crystalline semiconductor layer is rotated 30° with respect to the lattice of the substrate.

28. The electronic device of claim 26 wherein the crystalline semiconductor layer comprises a Group III-nitride alloy.

29. The electronic device of claim 28 wherein the substrate comprises $MgAl_2O_4$ and the crystalline semiconductor layer comprises $In_{0.31}Ga_{0.69}N$ (w).

30. The electronic device of claim 28 wherein the substrate comprises Si or GaP and the crystalline semiconductor layer comprises $In_{0.38}Ga_{0.62}N$ (w).

31. The electronic device of claim 27 wherein the device is a multiple junction solar cell comprising:
a substrate having a cubic crystal system structure; and
a crystalline semiconductor layer having a cubic crystalline structure.

32. The electronic device of claim 31 wherein the substrate comprises one of a Group IV semiconductor, a Group III-V semiconductor, a Group II-VI semiconductor, a Group IV semiconductor alloy, a Group III-V semiconductor alloy, and a Group II-VI semiconductor alloy and the crystalline semiconductor layer comprises one of a Group IV semiconductor, a Group III-V semiconductor, a Group II-VI semiconductor, a Group IV semiconductor alloy, a Group III-V semiconductor alloy, and a Group II-VI semiconductor alloy.

33. The electronic device of claim 27 wherein the device is a multiple junction solar cell comprising:
a substrate having a cubic crystal system structure; and
a crystalline semiconductor layer having a hexagonal crystalline structure.

34. The electronic device of claim 33 wherein the substrate comprises one of a Group IV semiconductor, a Group III-V semiconductor, a Group II-VI semiconductor, a Group IV semiconductor alloy, a Group III-V semiconductor alloy, and a Group II-VI semiconductor alloy and the crystalline semiconductor layer comprises one of a Group III-V semiconductor, a Group II-VI semiconductor, a Group III-V semiconductor alloy, and a Group II-VI semiconductor alloy.

* * * * *